US012805011B2

(12) United States Patent
Bao et al.

(10) Patent No.: US 12,805,011 B2
(45) Date of Patent: Nov. 17, 2026

(54) METAL GATE BOUNDARY CONTROL IN STACKED TRANSISTORS

(71) Applicant: International Business Machines Corporation, Armonk, NY (US)

(72) Inventors: Ruqiang Bao, Niskayuna, NY (US); Jingyun Zhang, Albany, NY (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 442 days.

(21) Appl. No.: 18/545,343

(22) Filed: Dec. 19, 2023

(65) Prior Publication Data

US 2025/0204041 A1 Jun. 19, 2025

(51) Int. Cl.

*H01L 27/12* (2006.01)
*H10D 86/01* (2025.01)
*H10D 86/40* (2025.01)
*H10D 86/60* (2025.01)

(52) U.S. Cl.

CPC ......... *H10D 86/021* (2025.01); *H10D 86/421* (2025.01); *H10D 86/431* (2025.01); *H10D 86/60* (2025.01)

(58) Field of Classification Search

CPC .... H10D 86/021; H10D 86/60; H10D 86/431; H10D 86/421; H10D 84/851; H10D 84/8314; H10D 84/8311; H10D 88/00
See application file for complete search history.

(56) References Cited

U.S. PATENT DOCUMENTS

| | | | | |
|---|---|---|---|---|
| 8,680,623 | B2 | 3/2014 | Frank et al. | |
| 10,699,942 | B2 | 6/2020 | Xie et al. | |
| 10,755,985 | B2 | 8/2020 | Mochizuki et al. | |
| 12,490,480 | B2 * | 12/2025 | Mukesh | H10D 30/0198 |
| 2023/0170348 | A1 | 6/2023 | Guo et al. | |
| 2025/0048688 | A1 * | 2/2025 | Xie | H10D 30/014 |
| 2025/0113604 | A1 * | 4/2025 | Sano | H10D 30/014 |

OTHER PUBLICATIONS

Erben et al, Work function setting in high-k metal gate devices, Complementary Metal Oxide Semiconductor. 14 pages. http://dx.doi.org/10.5772/intechopen.78335.

Robertson et,al, "High-K materials and metal gates for CMOS applications", Materials Science and Engineering: R: Reports, 88, 1-41. 77 pages.

* cited by examiner

*Primary Examiner* — Lawrence C Tynes, Jr.
(74) *Attorney, Agent, or Firm* — SCULLY, SCOTT, MURPHY & PRESSER, P.C.; Edward Wixted

(57) ABSTRACT

A semiconductor device and methods for forming the semiconductor device are described. The semiconductor device can include a top transistor and a bottom transistor arranged in a stack configuration, and an isolation layer situated between the top transistor and the bottom transistor. The top transistor can be encompassed by a high-k gate dielectric. The bottom transistor can be encompassed by a metal-doped high-k gate dielectric. A first portion of the isolation layer can be encompassed by the high-k gate dielectric. A second portion of the isolation layer can be encompassed by the metal-doped high-k gate dielectric. The metal-doped high-k gate dielectric can encompass the bottom transistor and the second portion of the isolation layer can be encompassed by a layer of first work function material (WFM). The first WFM can be encompassed by a second WFM.

16 Claims, 22 Drawing Sheets

2400

METAL GATE BOUNDARY CONTROL IN STACKED TRANSISTORS

BACKGROUND

The present application relates to fabrication methods and resulting structures for semiconductor devices. More specifically, the present application relates to metal gate boundary control in stacked transistors.

A stacked nanosheet transistor can enhance performance and scalability in semiconductor technology when compared to conventional transistors with a flat structure. Stacked nanosheet transistors can include multiple thin, horizontal layers (e.g., nanosheets) of semiconductor material stacked on top of each other. These nanosheets can be made of materials such as silicon and can be arranged vertically, creating a three-dimensional structure. Each layer can act as a channel for current to pass through. The gate material that surrounds these layers can enable precise control over the flow of electrons across multiple layers. Further, stacked nanosheet transistors can offer improved scalability when compared to conventional transistors with flat structure, such as allowing increased density without sacrificing performance.

SUMMARY

In one embodiment, a method for forming a semiconductor structure is generally described. The method can include depositing a dipole layer on a device comprising at least two stacked transistors and an isolation layer. The two stacked transistors can include at least a top transistor and a bottom transistor, and the isolation layer can be situated between the top transistor and the bottom transistor. The method can further include depositing a layer of sacrificial metal on the dipole layer. The method can further include depositing an organic planarization layer (OPL) on the sacrificial metal. The method can further include reducing the OPL to a level that aligns with a top surface of the isolation layer. The method can further include etching the sacrificial metal to form a set of recesses on sidewalls of the isolation layer. The depths of the set of recesses can define a transition boundary between the top transistor and the bottom transistor. In response to etching the sacrificial metal, a first portion of the sacrificial metal can remain above the top surface of the isolation layer and a second portion of sacrificial metal can remain below the transition boundary. The method can further include reflowing the OPL into the set of recesses to form volumes of OPL that cover the second portion of the sacrificial metal. The method can further include removing the first portion of the sacrificial metal. In response to removing the first portion of the sacrificial metal, the second portion of the sacrificial metal can remain below the volumes of OPL and below the transition boundary. The method can further include removing the OPL. The method can further include annealing the top and bottom transistors based on the dipole layer to form metal-doped devices with high-k gate dielectric.

In one embodiment, a method for forming a semiconductor structure is generally described. The method can include depositing a dipole layer on a device comprising at least two stacked transistors and an isolation layer. The two stacked transistors can include at least a top transistor and a bottom transistor, and the isolation layer can be situated between the top transistor and the bottom transistor. The method can further include depositing a layer of sacrificial metal on the dipole layer. The method can further include depositing a first organic planarization layer (OPL) on the sacrificial metal. The method can further include reducing the first OPL to a level that aligns with a top surface of the isolation layer. The method can further include etching the sacrificial metal to form a first set of recesses on sidewalls of the isolation layer. The depths of the first set of recesses can define a transition boundary between the top transistor and the bottom transistor. In response to etching the sacrificial metal, a first portion of the sacrificial metal can remain above the top surface of the isolation layer and a second portion of the sacrificial metal can remain below the transition boundary. The method can further include reflowing the first OPL into the first set of recesses to form volumes of first OPL that cover the second portion of the sacrificial metal. The method can further include removing the first portion of the sacrificial metal. In response to removing the first portion of the sacrificial metal, the second portion of the sacrificial metal can remain below the volumes of the first OPL and below the transition boundary. The method can further include removing the first OPL. The method can further include annealing the top and bottom transistors based on the dipole layer to form metal-doped devices with high-k gate dielectric. The method can further include depositing a layer of work function material (WFM) to cover the top transistor and the bottom transistor. The method can further include depositing a second OPL on the WFM. The method can further include reducing the second OPL to a level that aligns with the top surface of the isolation layer. The method can further include etching the WFM to form a second set of recesses on sidewalls of the isolation layer. In response to etching the WFM, a first portion of the WFM can remain above the top surface of the isolation layer, a second portion of the WFM can remain below the top surface of the isolation layer, and the second portion of the WFM can continue to cover the second portion of the sacrificial metal. The method can further include reflowing the second OPL into the second set of recesses to form volumes of the second OPL that cover the second portion of the WFM. The method can further include removing the first portion of the WFM. In response to removing the first portion of the WFM, the second portion of the WFM can remain below the volumes of the second OPL and below the top surface of the isolation layer. The method can further include removing the second OPL.

In one embodiment, a semiconductor device is generally described. The semiconductor device can include a top transistor, a bottom transistor arranged in a stacked configuration with the top transistor, and an isolation layer situated between the top transistor and the bottom transistor. The top transistor can be encompassed by a high-k gate dielectric. The bottom transistor can be encompassed by a metal-doped high-k gate dielectric. A first portion of the isolation layer can be encompassed by the high-k gate dielectric. A second portion of the isolation layer can be encompassed by the metal-doped high-k gate dielectric. The metal-doped high-k gate dielectric can encompass the bottom transistor and the second portion of the isolation layer can be encompassed by a layer of first work function material (WFM). The first WFM can be encompassed by a second WFM.

Further features as well as the structure and operation of various embodiments are described in detail below with reference to the accompanying drawings. In the drawings, like reference numbers indicate identical or functionally similar elements.

DETAILED DESCRIPTION

Figure 1:
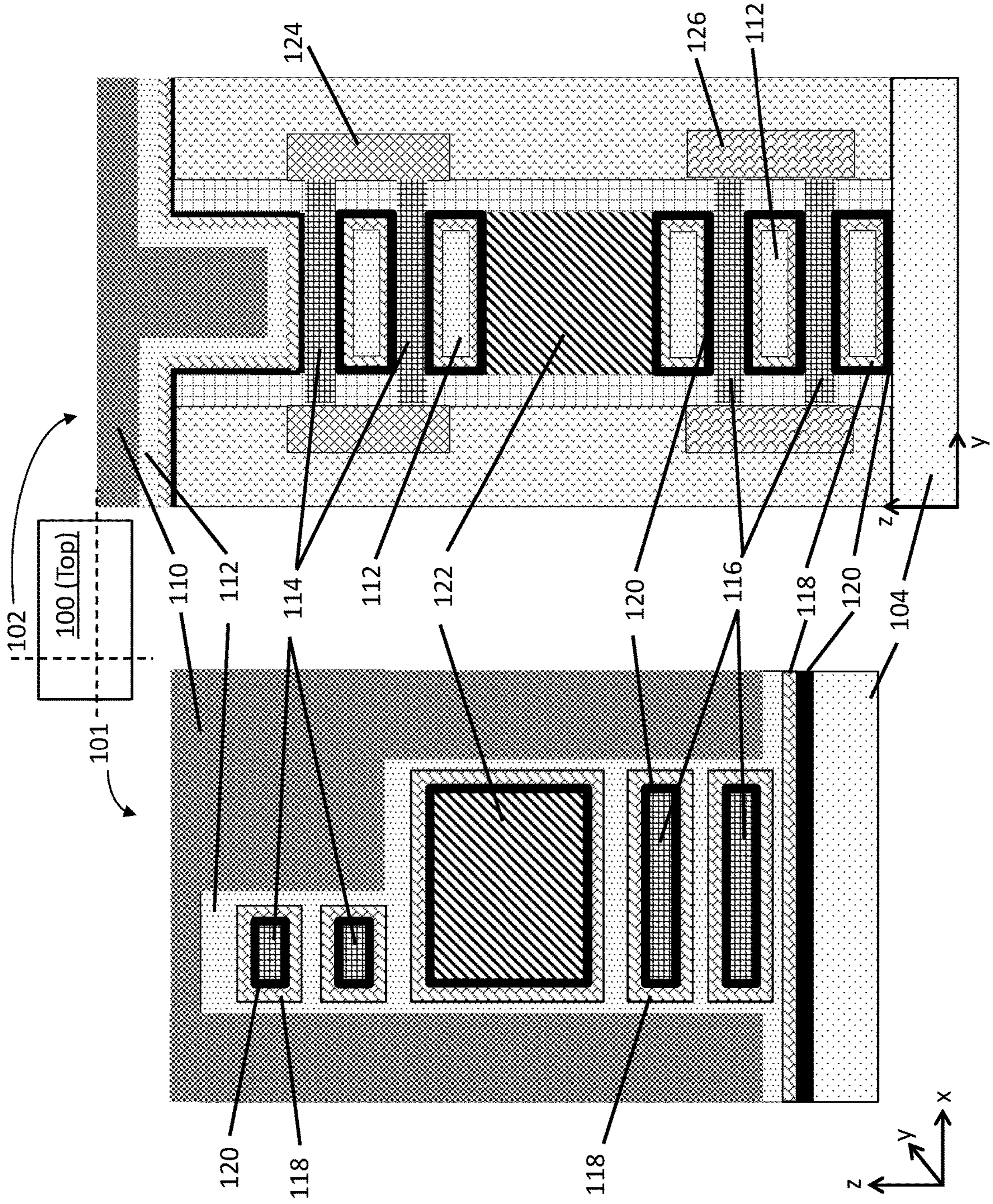
FIG. 1 illustrates cross-sectional views of a structure for metal gate boundary control in stacked transistors in one embodiment.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following descriptions, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "underneath", "beneath" or "under" another element, it can be directly beneath or under the other element, or intervening elements may be present. In contrast, when an element is referred to as being "directly underneath", "directly beneath" or "directly under" another element, there are no intervening elements present.

In an aspect, stacked transistors can include multiple layers or regions of different semiconductor materials, such as nanosheets, and doping types such as alternating n-type and p-type regions. The metal gate boundary between these layers of different types, or N/P boundary, can face challenges associated with the abrupt transition or interface between the N-type and P-type regions within the device structure. The N/P boundary needs to be well-defined such that the transitions can occur smoothly without problems. In an aspect, doping concentration can be crucial for achieving a smooth transition between N-type and P-type regions without abrupt changes as sudden changes can lead to unintended leakage currents and can reduce device performance. The N/P boundary may also suffer from interface defects that can cause carrier recombination or trapping, which affects the transistor's efficiency and performance. Sudden changes in the doping process or the presence of defects at the N/P boundary can also impact the long-term reliability and stability of the stacked transistors.

FIG. 1 illustrates cross-sectional views of a structure for metal gate boundary control in stacked transistors in one embodiment. In an example embodiment shown in FIG. 1, cross-sectional views 101 and 102 of a structure 100 are shown. Using a three dimensional coordinate system with x, y, z axis shown in FIG. 1, cross-sectional view 101 can lie in the x-z plane and cross-sectional view 102 can lie in the y-z plane. When viewed from a top surface of structure 100, cross-sectional view 101 of structure 100 can be orthogonal to cross-sectional view 102 of structure 100. Structure 100 can include a substrate 104 at a bottommost layer (e.g., bottom being towards-z direction). Structure 100 can include at least two devices, such as stacked transistors, stacked in a vertical arrangement (e.g., vertical being along the z-axis). In an aspect, when transistors are stacked in a vertical arrangement, source to drain current of the transistors can flow in a direction, such as along the z-axis, that is perpendicular to a surface (e.g., x-y plane) of substrate 104.

In the example shown in FIG. 1, structure 100 can include at least one top device such as top device(s) 114 and at least one bottom device such as bottom device(s) 116. Top devices 114 and bottom devices 116 can be, for example, stacked transistors such as nanosheet transistors made of a stack of nanosheets. A nanosheet can be formed by one or more semiconductor materials such as silicon, graphene, transition metal dichalcogenides (TMDs), or certain types of oxides. A nanosheet can be an ultra-thin structure, such as measuring just a few nanometers in thickness (e.g., one billionth of a meter). The gates, or gate electrodes, of top devices 114 are shown as metal 124 in cross-sectional view 102 and the gates, or gate electrodes, of bottom devices 114 are shown as metal 126 in cross-sectional view 102. Top devices 114 and bottom devices 116 can have different characteristics. In one embodiment, the processes described herein can cause top devices 114 to have P-type characteristics (e.g., positive charge carriers) and bottom devices 116 to have N-type characteristics (e.g., negative charge carriers). In another embodiment, the processes described herein can cause top devices 114 to have N-type characteristics and bottom devices 116 to have P-type characteristics.

To define a transition boundary, or an N/P boundary, between top devices 114 and bottom devices 116, each one of top devices 114 and bottom devices 116 can be encompassed by a layer of dielectric materials 120. A layer of dipole materials 118 ("dipole 118") can encompass the dielectric materials 120 ("dielectric 120"). A layer of sacrificial metal 112 can be deposited to encompass dipole materials 118. An organic planarization layer (OPL) 110 is also deposited to encompass sacrificial metal 112. An isolation layer 122 can be situated between top devices 114 and bottom devices 116 to separate and electrically isolate top devices 114 and bottom devices 116. Isolation layer 122 can also be encompassed by dielectric materials 120, dipole materials 118 and sacrificial metal 112. Sacrificial metal 112 can be, for example, metal nitride including one of Titanium Nitride (TiN) and Tungsten Nitride (WN). In one embodiment, dipole materials 118 can be materials including Lanthanum (La), Aluminum (Al), Magnesium (Mg), Yttrium (Y) and the P-type doping can use p-dipole such as materials including La, Al, Mg, Y, Niobium (Nb), Titanium (Ti), Gallium (Ga). The arrangement of top devices 114, isolation layer 122 and bottom devices 116 can be deposited on top of a substrate 104. Dipole materials 118, dielectric materials 120 and sacrificial metal 112 can also be deposited between bottom devices 116 and substrate 104 as shown in cross-sectional view 101.

Isolation layer 122 can be an isolation or interlevel dielectric (ILD) layer formed of silicon oxide or another suitable material such as silicon oxycarbide (SiOC), silicon oxynitride, SiON, or other types of isolation materials. Dielectric materials 120 can include high-k dielectric materials that has a dielectric constant (e.g., permittivity) higher than the dielectric constant of silicon oxide ($SiO_2$). Examples of high-k dielectric materials can include metal oxides such as hafnium oxide, tantalum oxide, titanium oxide, aluminum oxide, or other metal oxides. OPL 110 can include organic materials that are flowable, such as photoresist, various types of polymers and dielectrics, or other types of materials that are flowable. OPL 110 can be deposited on sacrificial metal 112 using various techniques, such as by spin on or deposited through physical vapor deposition (PVD), chemical vapor deposition (CVD), atomic layer deposition (ALD), or a combination of such deposition methods.

In embodiments where top devices 114 are to be P-doped to have P-type characteristics and bottom devices 116 are to be N-doped to have N-type characteristics, dipole materials 118 can be N-type dipole materials and sacrificial metal 112 can be N-type work function metals. In embodiments where top devices 114 are N-doped to have N-type characteristics and bottom devices 116 are to be P-doped to have P-type characteristics, dipole materials 118 can be P-type dipole materials and sacrificial metal 112 can be P-type work function metals.

Sacrificial metal 112 can include, for example, work function metals. The thickness of sacrificial metal 112 may be within a range from about 1-10 nanometers (nm). P-type work function materials can include compositions such as ruthenium, palladium, platinum, cobalt, nickel, and conductive metal oxides, conductive nitrides such as titanium nitride, conductive carbide such as titanium carbide, and/or any combination thereof. N-type metal materials include compositions such as hafnium, zirconium, titanium, tantalum, aluminum, metal carbides (e.g., hafnium carbide, zirconium carbide, and aluminum carbide), aluminum-doped titanium carbide, aluminides, or any metallic aluminum or titanium containing metals or compounds or any combinations thereof. An example of an N-type work function metal can be a stack having a layer of titanium nitride followed by a layer of titanium carbide, which is followed by another layer of titanium nitride, thereby forming an n-type work function material.

A process to define the N/P boundary between top devices 114 and bottom devices 116 will be described in more detail below. The processes for defining the N/P boundary disclosed herein can utilize a reflow operation on OPL 110 to ensure that work function metals for bottom devices 116 are not exposed during the process to define the N/P boundary and also after the N/P boundary is defined. The processes described herein can also provide precise control on the N/P metal gate distance and appropriate threshold voltage both N-type transistors and P-type transistors in stacked configurations such as stacked transistors. Note that the descriptions herein correspond to embodiments where top devices 114 are doped as P-type transistors and bottom devices 116 are doped N-type transistors. The processes described herein can also be applicable to embodiments where top devices 114 are doped as N-type transistors and bottom devices 116 are doped as P-type transistors.

Figure 2:
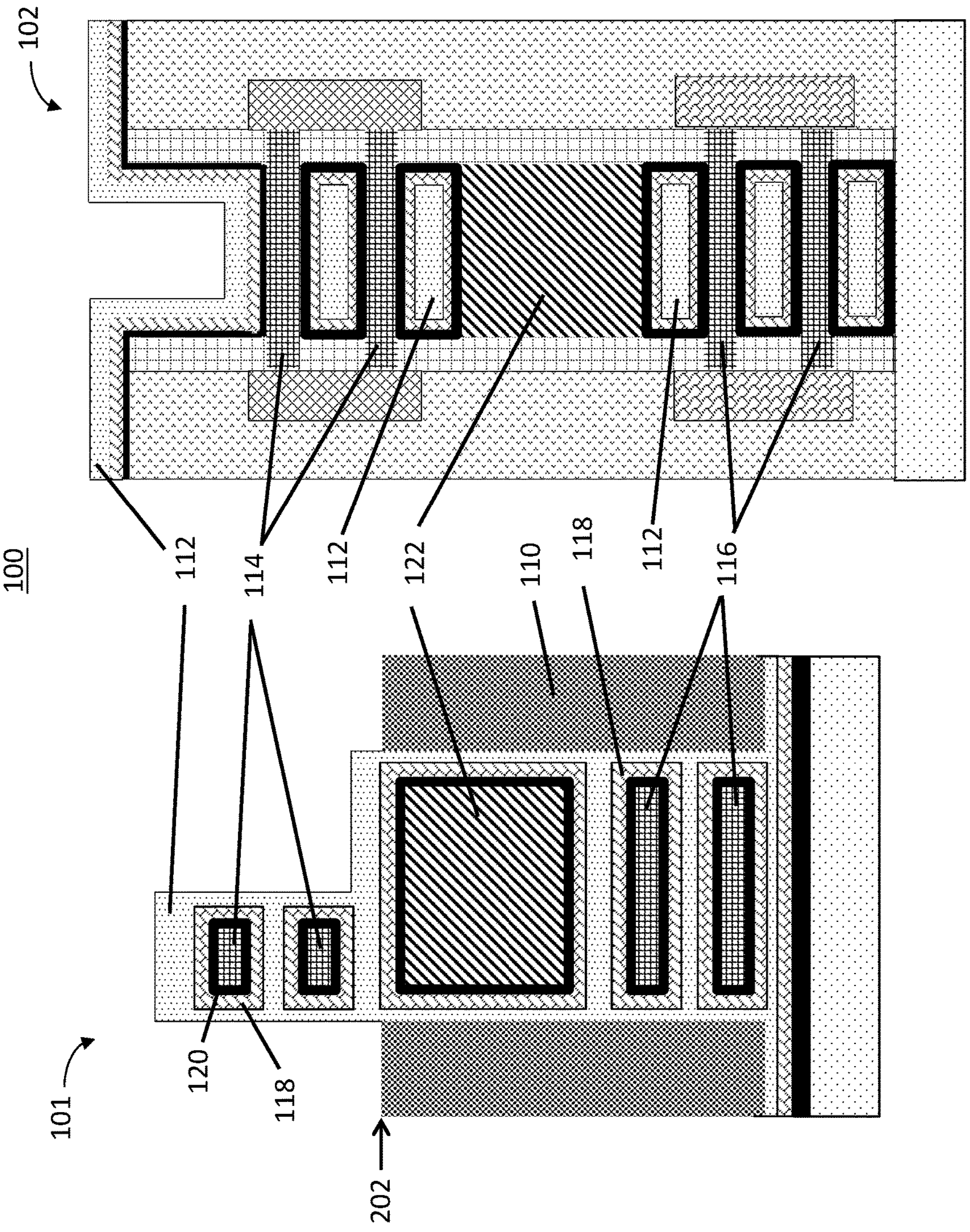
FIG. 2 illustrates cross-sectional views of the structure in FIG. 1 after a baking operation in one embodiment.

FIG. 2 illustrates cross-sectional views of the structure in FIG. 1 after a baking operation in one embodiment. In one embodiment, structure 100 shown in FIG. 1 can undergo a low temperature baking operation to reduce OPL 110 to a level 202 as shown in cross-sectional view 101. An example range of temperatures for the low temperature baking operation of OPL 110 can be approximately include 100-250 Celsius (° C.). Level 202 can align with (e.g., same vertical level on z-axis) a top surface of isolation layer 122. The low temperature being used for the low temperature baking operation can stabilize OPL 110 material to allow a wet or dry etch to remove portions of OPL 110 without causing reflow of OPL 110. As shown in cross-sectional views 101 and 102, portions of OPL 110 above top devices 114 are removed as a result of the low temperature baking operation.

Figure 3:
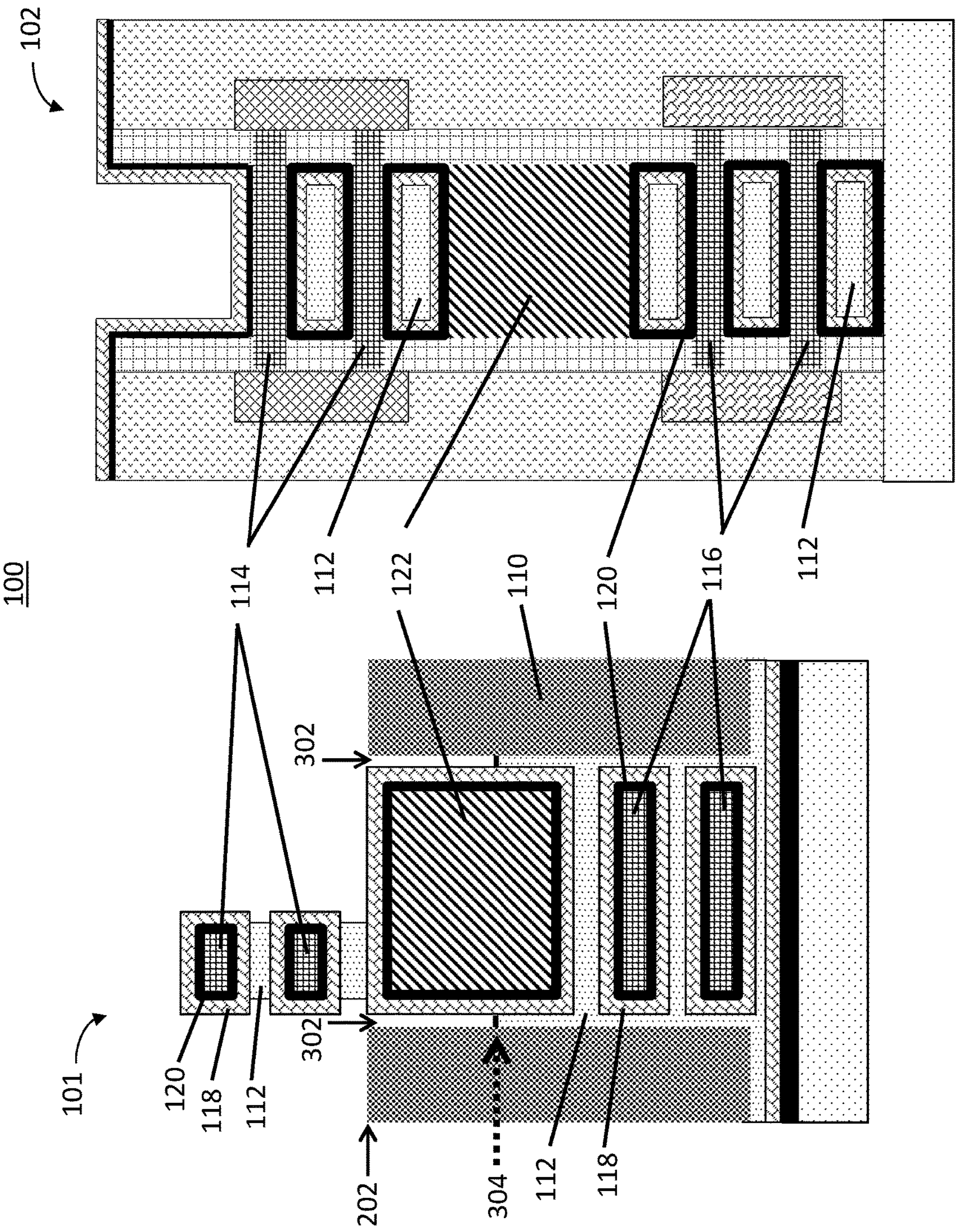
FIG. 3 illustrates cross-sectional views of the structure in FIG. 2 after an etching operation in one embodiment.

FIG. 3 illustrates cross-sectional views of the structure in FIG. 2 after an etching operation in one embodiment. In one embodiment, a metal etching operation can be performed to etch the sacrificial metal 112 until two recesses 302 are formed, where each one of recesses 302 can be between a sidewall of isolation layer 122 and OPL 110. The etching of sacrificial metal 112 can include a wet etch chemistry or dry etch chemistry. In one or more embodiments, an example wet etch to form recesses 302 can include using different chemicals for during durations of time during the wet etch operation. In one or more embodiments, an example dry etch to form recesses 302 can include reactive ion etching, ion beam etching, plasma etching, laser ablation, or other dry etch techniques.

In one embodiment, the chemicals being used in the etching and the duration of the etching can impact a size, such as a depth (e.g., along the z-axis in FIG. 1), of recess 302. In the embodiment shown in FIG. 3, the etching cause recesses 302 to have a depth of level 304 from its previous level 202 shown in FIG. 2. Further, the etching can cause an amount of sacrificial metal 112 to remain underneath (e.g., −z direction) each one of top devices 114. In one embodiment, the chemicals being used in the etching and the duration of the etching can be predefined to ensure that portions of sacrificial metal 112 remain underneath top devices 114 and recesses 302 do not pass below level 304. In one embodiment, level 304 can be a depth level that defines a transition boundary, or an N/P boundary, between top devices 114 and bottom devices 116. Therefore, the etching of sacrificial metal 112 to form recesses 302 can be controlled (e.g., controlling duration of the etching) to define the N/P boundary between top devices 114 and bottom devices 116.

Figure 4:
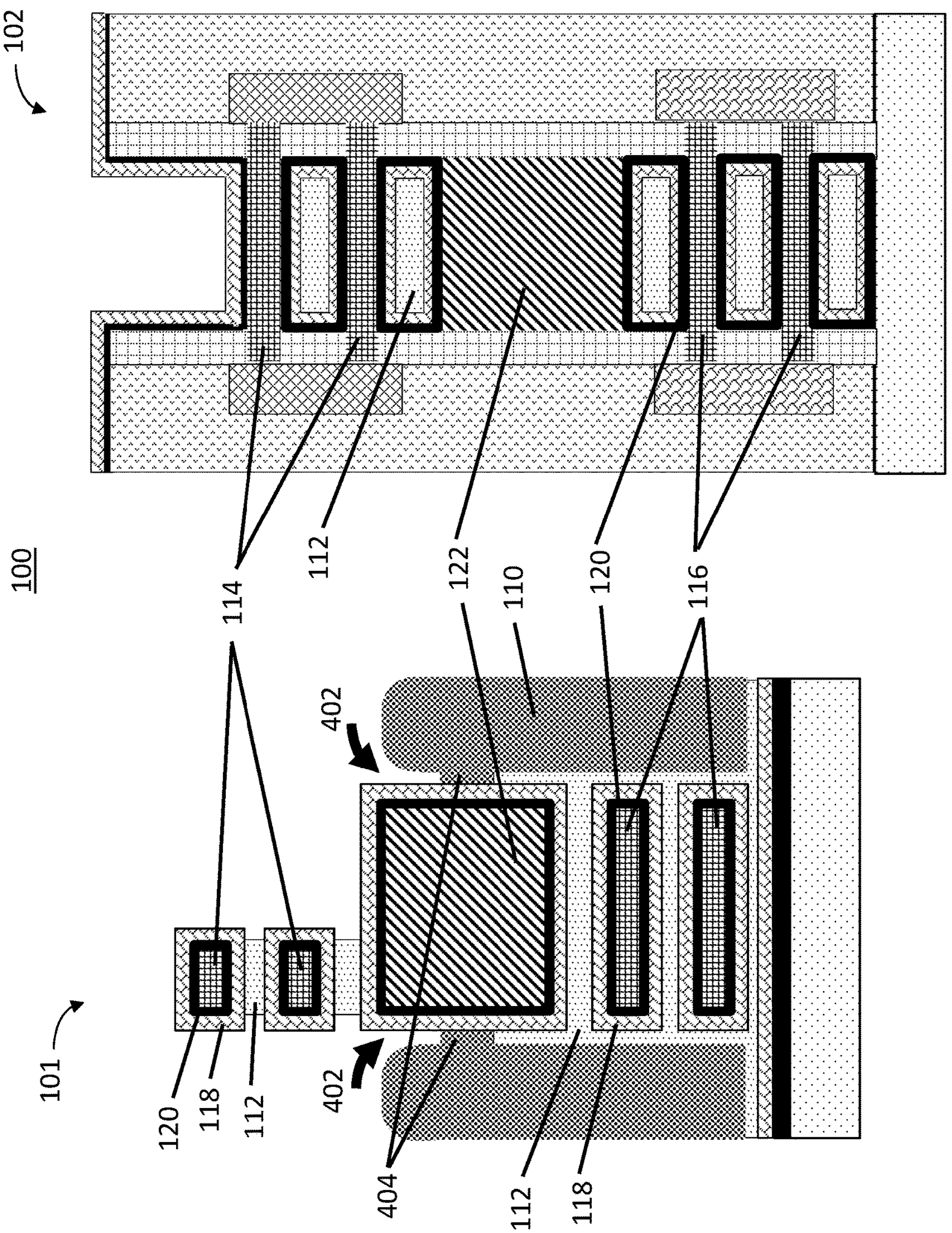
FIG. 4 illustrates cross-sectional views of the structure in FIG. 3 after a reflow operation in one embodiment.

FIG. 4 illustrates cross-sectional views of the structure in FIG. 3 after a reflow operation in one embodiment. In one embodiment, a reflow operation 402 can be performed to reflow OPL 110 into recesses 302 of FIG. 3. The reflow operation 402 can cause a volume of OPL 404 to be formed in recesses 302 and on top of sacrificial metal 112 between sidewalls of isolation layer 122 and OPL 110. As a result of forming OPL 404, sacrificial metal 112 will not be exposed to the top and further etching of sacrificial metal 112 can be performed without removing sacrificial metal 112 that is underneath the formed OPL 404.

In one or more embodiments, reflow operation 402 can include heating OPL 110 to a high temperature to decrease viscosity of OPL 110, which enables a portion of OPL 110 to flow in a controlled manner. In one embodiment, the reflow operation 402 can include heating OPL 110 to a high temperature ranging from approximately 300-600° C. The temperature being used in the reflow operation 402 can be higher than the temperature being used in the low temperature baking process associated with FIG. 2. In one or more embodiments, the reflow operation 402 can include exposing OPL 110 to ultraviolet (UV) radiation (and thermal energy, i.e., increased temperatures) to decrease viscosity of OPL 110. In one or more embodiments, the reflow operation 402 can be controlled by the temperature, gas flow, and pressure applied to OPL 110.

Figure 5:
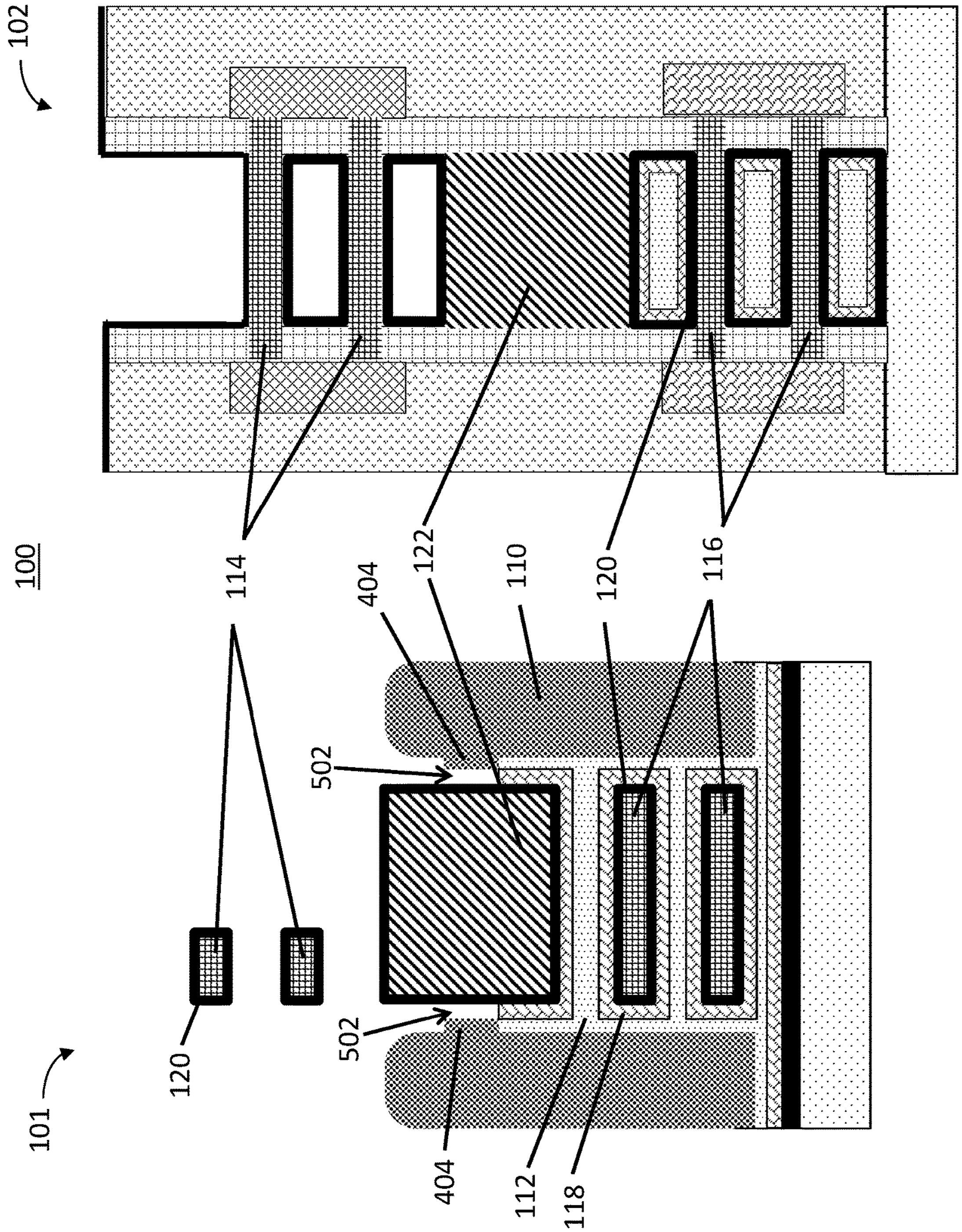
FIG. 5 illustrates cross-sectional views of the structure in FIG. 4 after an etching operation in one embodiment.

FIG. 5 illustrates cross-sectional views of the structure in FIG. 4 after an etching operation in one embodiment. In one embodiment, a metal etching operation can be performed to remove any sacrificial metal 112 and dipole 118 that are above OPL 110 and OPL 404 (see FIG. 4). As shown in cross-sectional views 101 and 102, in response to the etching, there are no WFM deposited underneath top devices 114. The etching operation to remove sacrificial metal 112 and dipole 118 above OPL 110 and OPL 404 can include a wet etch chemistry or dry etch chemistry. Also, WFM that are underneath OPL 404 can be protected by OPL 404 during the metal etching operation to remove sacrificial metal 112 and dipole 118 above OPL 110 and OPL 404. The etching to remove sacrificial metal 112 and dipole 118 in FIG. 5 can be performed until dipole 118 reaches a level 502, where level 502 can align with level 304 shown in FIG. 3 (e.g., the top of sacrificial metal 112, and level 502 can be equivalent to level 304). Due to the reflow operation 402 in FIG. 4 forming OPL 404, the etching of sacrificial metal 112 can be controlled to cause dipole 118 to be reduced to level 502 without etching into sacrificial metal 112 underneath OPL 404. If OPL 404 were not formed, the etching in FIG. 5 may etch away portions of sacrificial metal 112 below level 304 or below the target N/P boundary set by level 304.

Figure 6:
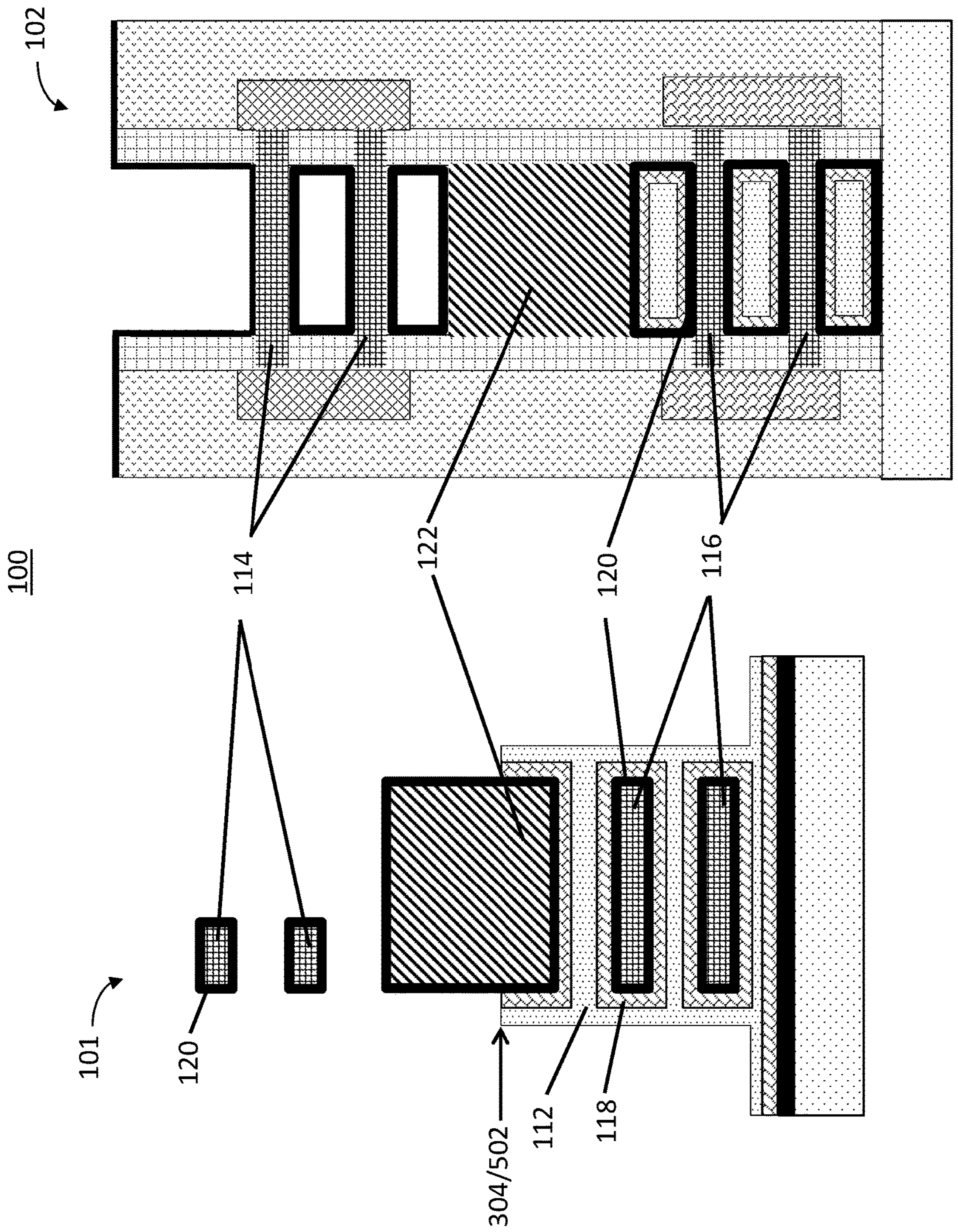
FIG. 6 illustrates cross-sectional views of the structure in FIG. 5 after an ashing operation in one embodiment.

FIG. 6 illustrates cross-sectional views of the structure in FIG. 5 after an ashing operation in one embodiment. In one embodiment, an ashing operation can be performed on the structure shown in FIG. 5 to remove OPL 110 and OPL 404. In one embodiment, the ashing can include converting OPL 110 and OPL 404 to ash through plasma exposure. Upon the ashing operation, sacrificial metal 112 and dipole 118 can remain on a portion of the sidewalls of isolation layer 122 and can remain aligned at level 304 or level 502.

Figure 7:
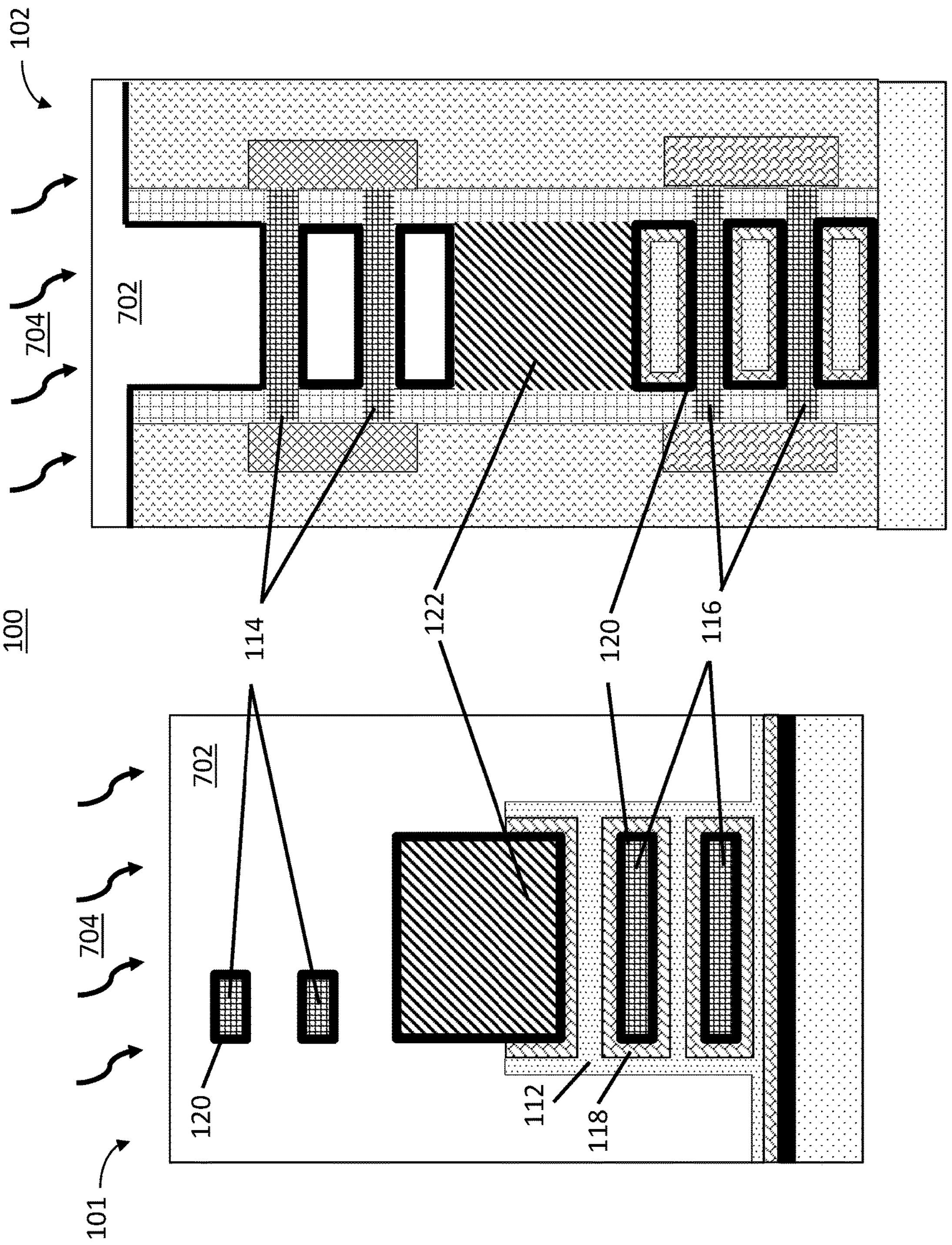
FIG. 7 illustrates cross-sectional views of the structure in FIG. 6 undergoing a metal doping operation in one embodiment.

FIG. 7 illustrates cross-sectional views of the structure in FIG. 6 undergoing a metal doping operation in one embodiment. In an aspect, metal doping is a process of introducing specific metal atoms into a semiconductor material to modify its electrical properties. Examples of metal doping can include, for example, ion implantation, diffusion, CVD, molecular beam epitaxy (MBE) and plasma doping. In the embodiment shown in FIG. 7, top devices 114 are to be doped as P-type transistors and bottom devices 116 are to be doped as N-type transistors, thus structure 100 can undergo N-type doping. To perform the N-type metal doping, amorphous silicon (a;Si) 702 can be deposited on structure 100 to surround the components of structure 100. The a;Si 702 can be a type of silicon material that lacks the crystalline structure found in typical silicon. The N-type metal doping can introduce metal from sacrificial metal 112 and dipole 118 (which is an N-type dipole if bottom devices 116 are to be doped as N-type transistors) into dielectric 120, such as by donating electrons from sacrificial metal 112 and dipole 118 into the crystal lattice of dipole 118 to create an excess of negatively charged electrons. An annealing process 704 can be performed to heat structure 100 to diffuse the dipole from dipole 118 and incorporate them into portions of dielectric 120 that are attached to dipole 118. In embodiments where top devices 114 are to be doped as N-type transistors and bottom devices 116 are to be doped as P-type transistors, structure 100 can undergo P-type doping. As mentioned above, dipole 118 can be materials including Lanthanum (La), Aluminum (Al), Magnesium (Mg), Yttrium (Y) and the P-type doping can use p-dipole such as materials including La, Al, Mg, Y, Niobium (Nb), Titanium (Ti), Gallium (Ga).

Figure 8:
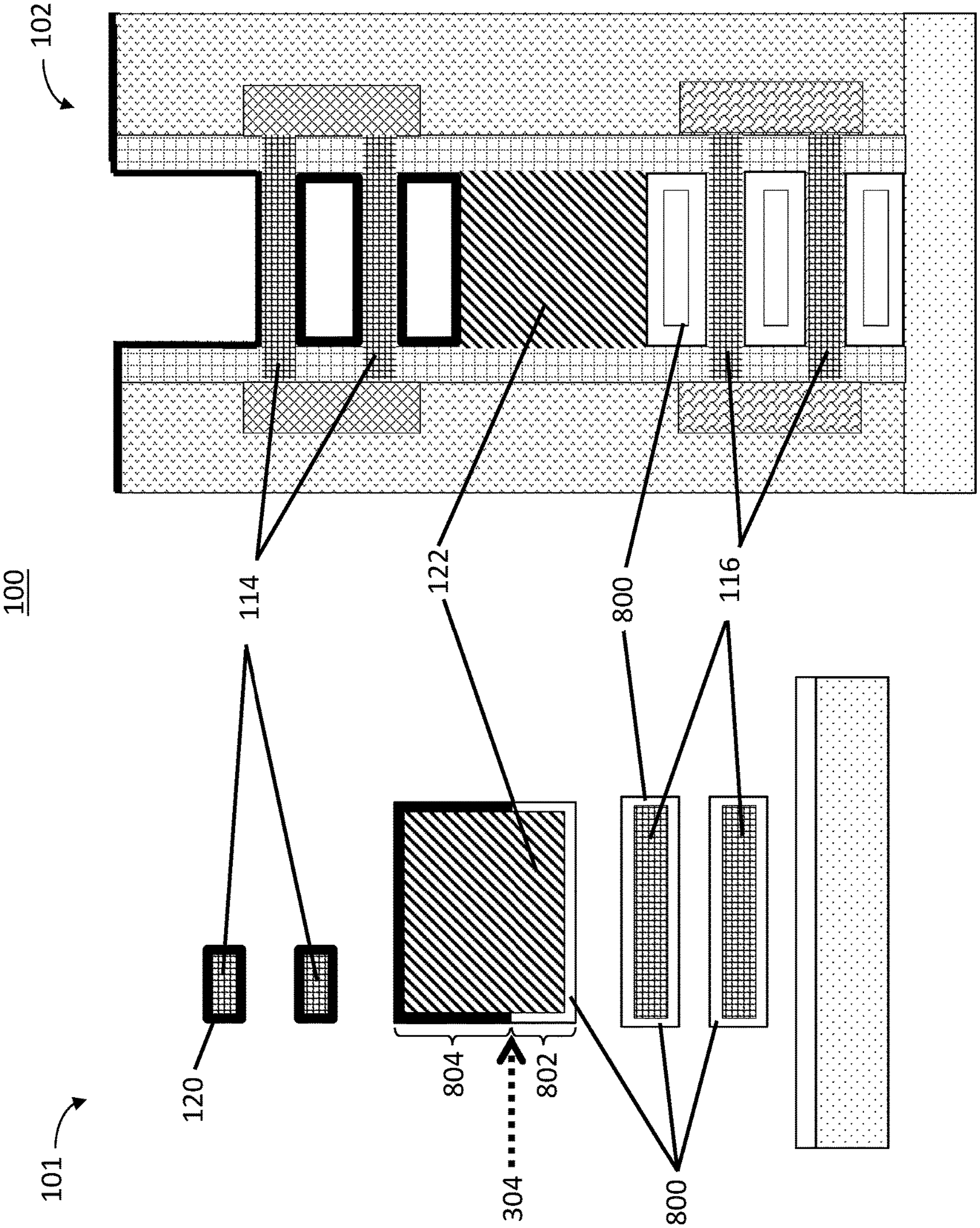
FIG. 8 illustrates cross-sectional views of the structure in FIG. 7 after the metal doping operation in one embodiment.

FIG. 8 illustrates cross-sectional views of the structure in FIG. 7 after the metal doping operation in one embodiment. Upon performing the metal doping in FIG. 7, a layer of metal-doped gate dielectric 800 can be formed on a portion of isolation layer 122 and on perimeters of bottom devices 116. Metal-doped gate dielectric 800 can include high-k dielectric materials such as dielectric 120. In the embodiment shown in FIG. 8, a bottom portion 802 of the sidewalls of isolation layer 122 can be metal doped and include metal-doped gate dielectric 800 and a top portion 804 of isolation layer 122 can include dielectric 120 that remained from the removal of sacrificial metal 112 as shown in FIG. 5. A boundary between portion 802 and portion 804 can be defined by level 304, which was a depth that defined recesses 302 in FIG. 3 and also a N/P boundary. As a result of performing the operations from FIG. 1 to FIG. 8, structure 100 can include bottom transistors (e.g., bottom devices 116) having metal-doped with high-k gate dielectrics (e.g., metal-doped gate dielectric 800), and top transistors (e.g., top devices 114) having high-k gate dielectrics (e.g., dielectric 120).

The combination of dipole 118, dielectric 120 and sacrificial metal 112, along with a vertical depth range of portion 802 (which can be based on depth of recesses 302) can define a threshold voltage of bottom devices 116. By way of example, if recesses 302 in FIG. 3 is deeper into the −z direction (see FIG. 1), then the portion 802 covering isolation layer 122 can be reduced and the threshold voltage of the N-type transistors, or bottom devices 116, can be reduced. If recesses 302 in FIG. 3 is shallower (up towards the z direction in FIG. 1), then the portion 802 covering isolation layer 122 can be increased and the threshold voltage of the N-type transistors, or bottom devices 116, can be increased as well.

Figure 9:
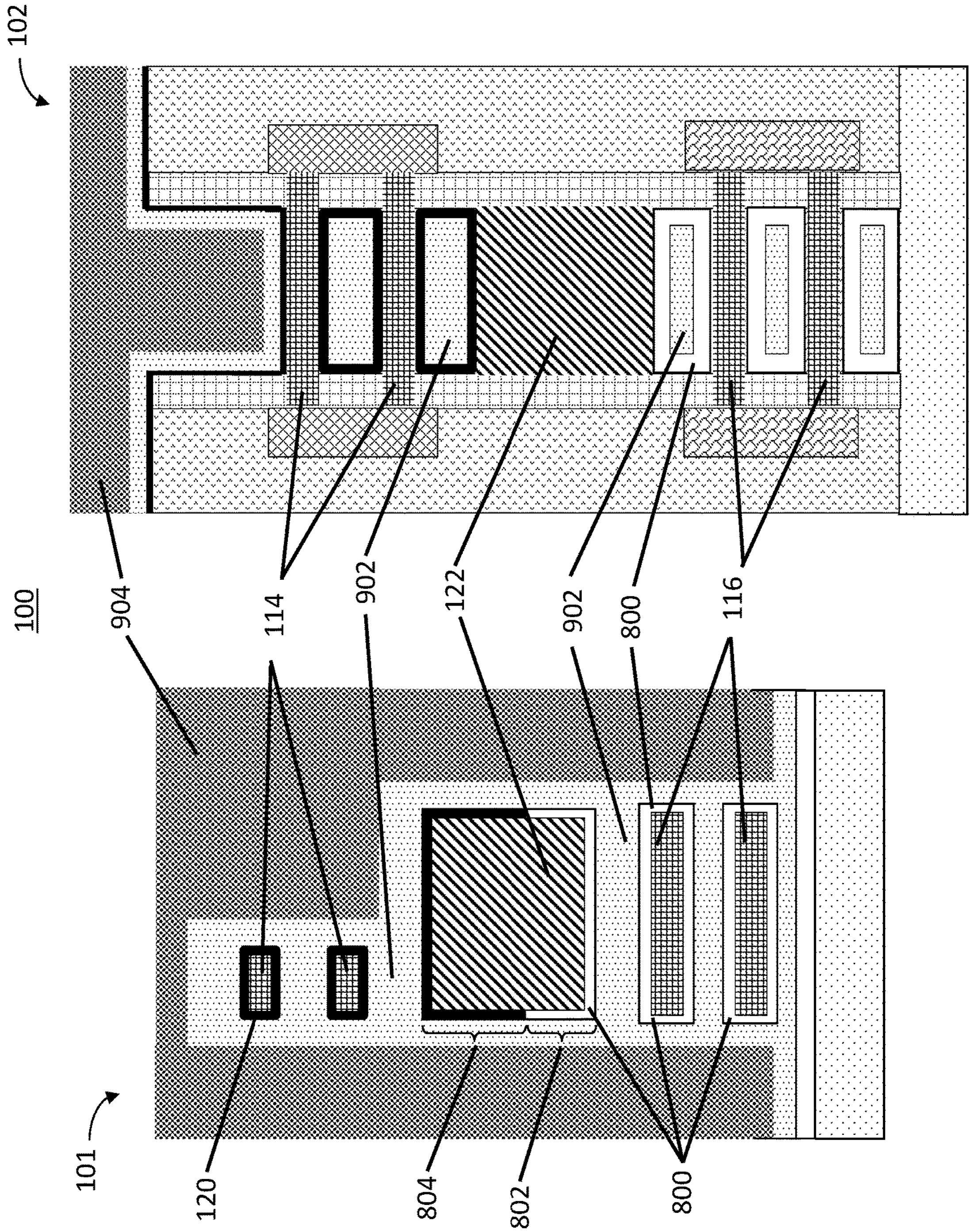
FIG. 9 illustrates cross-sectional views of the structure in FIG. 8 with work function materials and organic planarization layer in one embodiment.

FIG. 9 illustrates cross-sectional views of the structure in FIG. 8 with work function materials and organic planarization layer in one embodiment. In one embodiment, the operations from FIG. 1 to FIG. 6 can be repeated on structure 100 shown in FIG. 8. In FIG. 9, a layer of WFM 902 can be deposited to encompass structure 100 in FIG. 8. An OPL 904 is also deposited to encompass WFM 902. In the embodiment shown in FIG. 9, bottom devices 116 can be doped as N-type transistors and WFM 902 can be N-type work function metals. OPL 904 can include organic materials that are flowable, such as photoresist, various types of polymers and dielectrics, or other types of materials that are flowable. OPL 904 can be deposited on WFM 902 using various techniques, such as by spin on or deposited through PVD, CVD, ALD, or a combination of such deposition methods.

Figure 10:
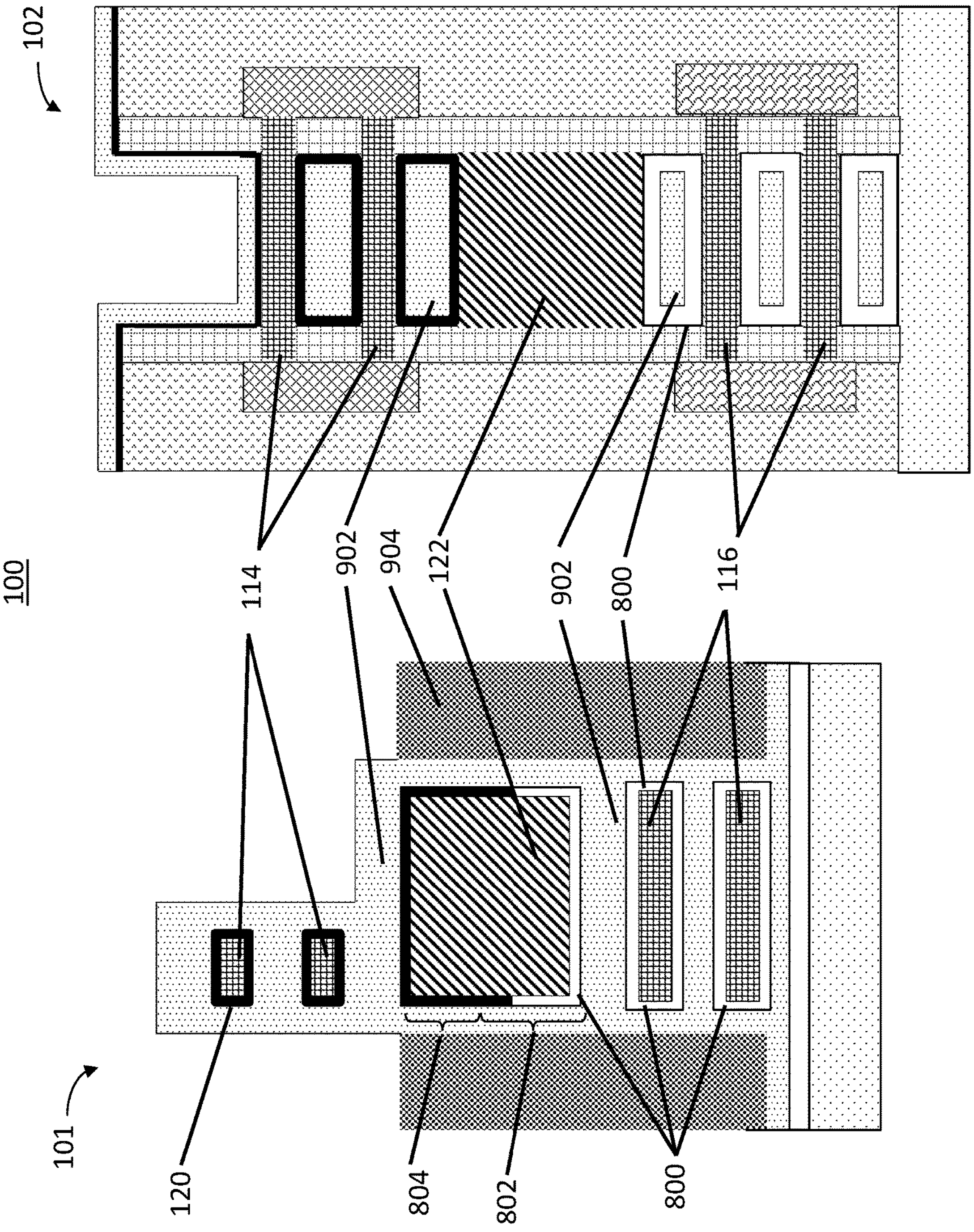
FIG. 10 illustrates cross-sectional views of the structure in FIG. 9 after a baking operation in one embodiment.

FIG. 10 illustrates cross-sectional views of the structure in FIG. 9 after a baking operation in one embodiment. In one embodiment, structure 100 shown in FIG. 9 can undergo a low temperature baking operation to reduce OPL 904 to align with the top surface of isolation layer 122, such as level 202 shown in FIG. 2. An example range of temperatures for the low temperature baking operation of OPL 904 can be approximately include 100-250 Celsius (C). The low temperature being used for the low temperature baking operation can stabilize OPL 904 material to allow a wet or dry etch to remove portions of OPL 904 without causing reflow of OPL 904. As shown in cross-sectional views 101 and 102, portions of OPL 904 above top devices 114 are removed as a result of the low temperature baking operation.

Figure 11:
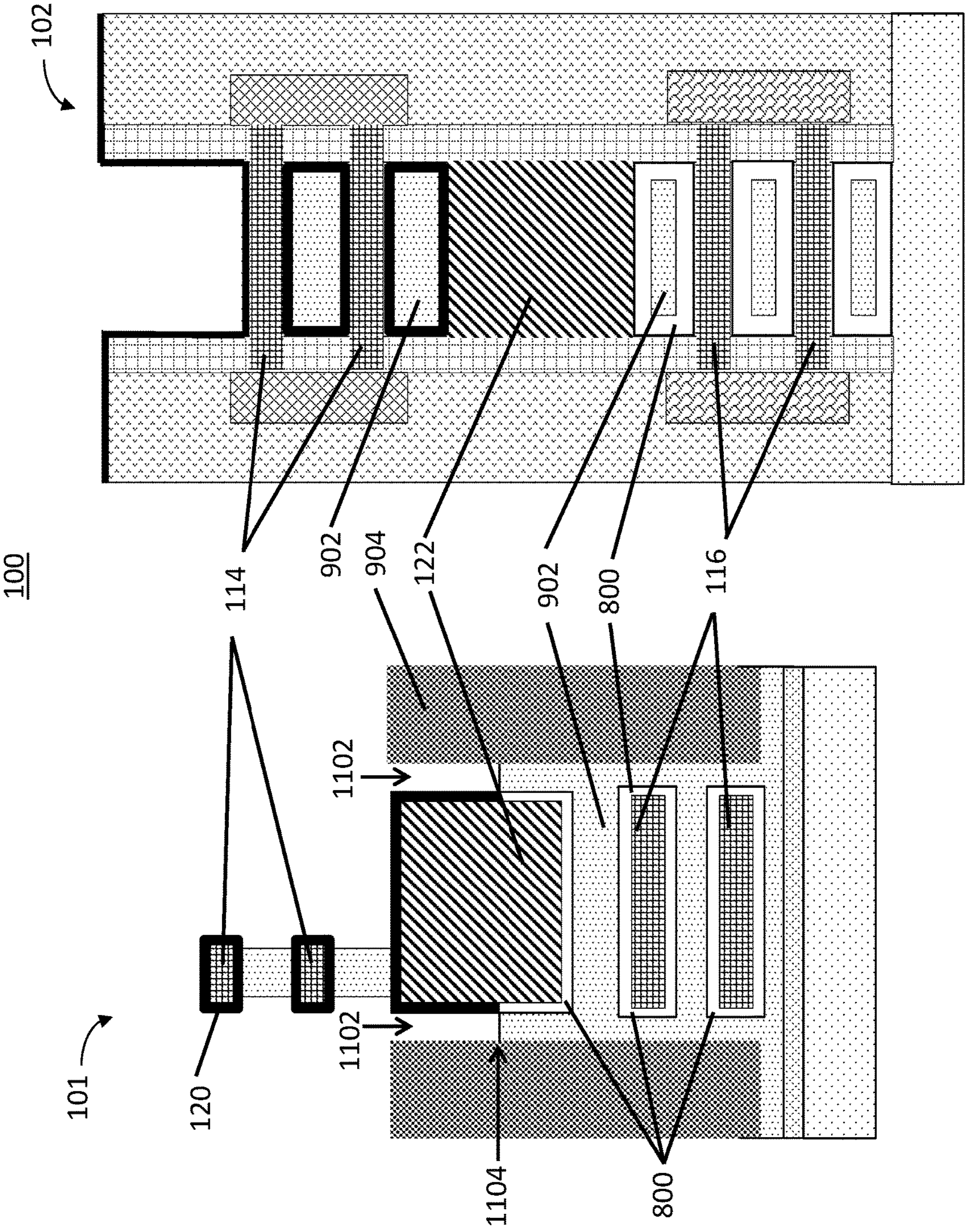
FIG. 11 illustrates cross-sectional views of the structure in FIG. 10 after an etching operation in one embodiment.

FIG. 11 illustrates cross-sectional views of the structure in FIG. 10 after an etching operation in one embodiment. In one embodiment, a metal etching operation can be performed to etch the WFM 902 until two recesses 1102 are formed, where each one of recesses 1102 can be between a sidewall of isolation layer 122 and OPL 904. The etching of WFM 902 can include a wet etch chemistry or dry etch chemistry. In one or more embodiments, an example wet etch to form recesses 1102 can include using different chemicals for during durations of time during the wet etch operation. In one or more embodiments, an example dry etch to form recesses 1102 can include reactive ion etching, ion beam etching, plasma etching, laser ablation, or other dry etch techniques.

In one embodiment, the chemicals being used in the etching and the duration of the etching can impact a size, such as a depth (e.g., along the z-axis in FIG. 1), of recess 1102. In the embodiment shown in FIG. 11, the etching can cause recesses 1102 to have a depth of level 1104 from its previous level shown in FIG. 10. Further, the etching can cause an amount of WFM 902 to remain underneath (e.g., −z direction) each one of top devices 114. In one embodiment, the chemicals being used in the etching and the duration of the etching can be predefined to ensure that portions of WFM 902 remain underneath top devices 114 and recesses 1102 do not pass below level 1104. In one embodiment, level 1104 can be a depth level that is equivalent to (e.g., z direction) level 304 shown in FIG. 3, level 502 shown in FIG. 5, or the N/P boundary shown in FIG. 8.

Figure 12:
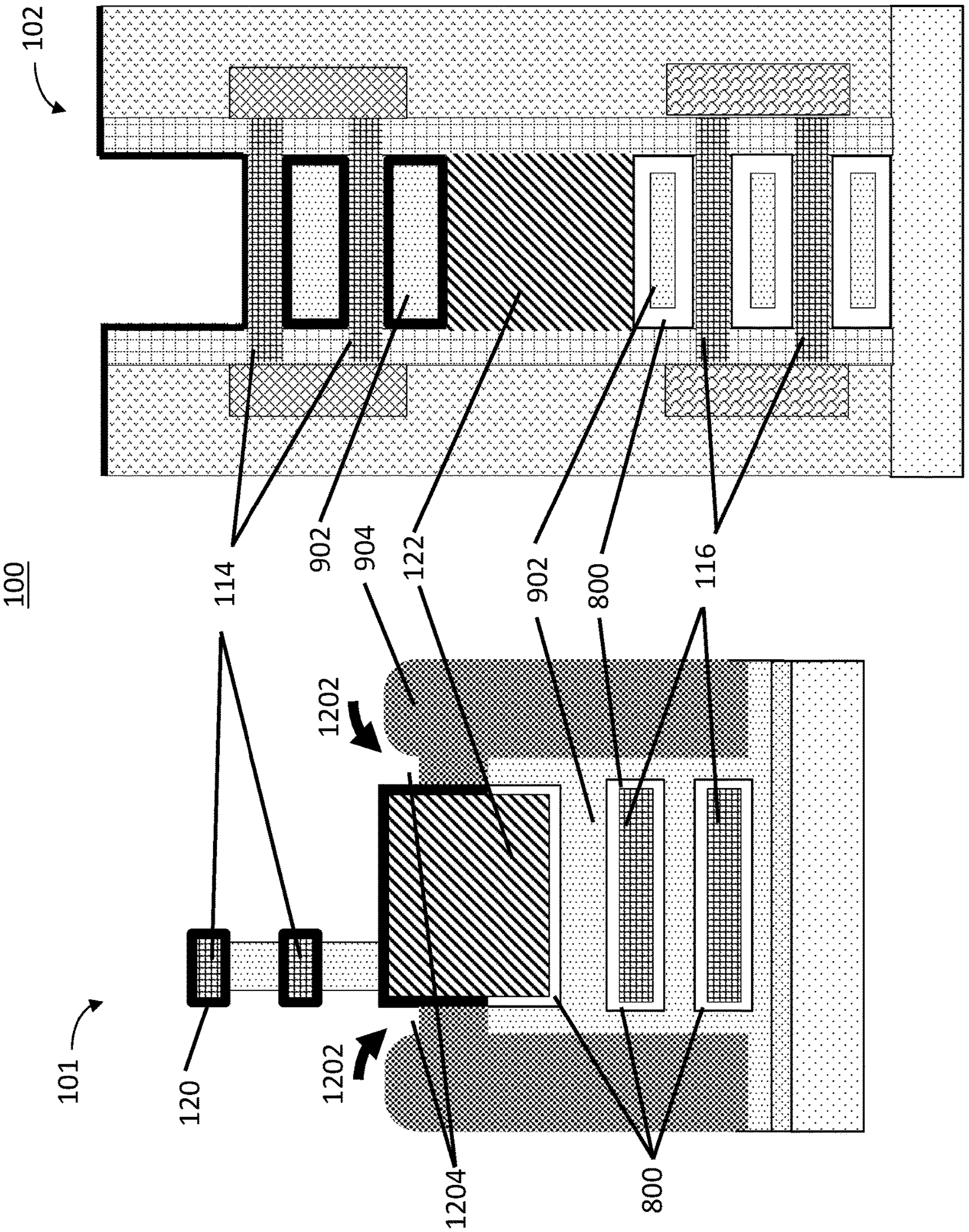
FIG. 12 illustrates cross-sectional views of the structure in FIG. 11 after a reflow operation in one embodiment.

FIG. 12 illustrates cross-sectional views of the structure in FIG. 11 after a reflow operation in one embodiment. In one embodiment, a reflow operation 1202 can be performed to reflow OPL 904 into recesses 1102 of FIG. 11. The reflow operation 1202 can cause a volume of OPL 1204 to be formed in recesses 1102 and on top of WFM 902 between sidewalls of isolation layer 122 and OPL 904. As a result of forming OPL 1204, WFM 902 will not be exposed to the top and further etching of WFM 902 can be performed without removing WFM 902 that is underneath the formed OPL 1204.

In one or more embodiments, reflow operation 1202 can include heating OPL 904 to a high temperature to decrease viscosity of OPL 904, which enables a portion of OPL 904 to flow in a controlled manner. In one embodiment, the reflow operation 1202 can include heating OPL 904 to a high temperature ranging from approximately 300-600° C. The temperature being used in the reflow operation 1202 can be higher than the temperature being used in the low temperature baking process associated with FIG. 10. In one or more embodiments, the reflow operation 1202 can include exposing OPL 904 to ultraviolet (UV) radiation (and thermal energy, i.e., increased temperatures) to decrease viscosity of OPL 904. In one or more embodiments, the reflow operation 1202 can be controlled by the temperature, gas flow, and pressure applied to OPL 904.

Figure 13:
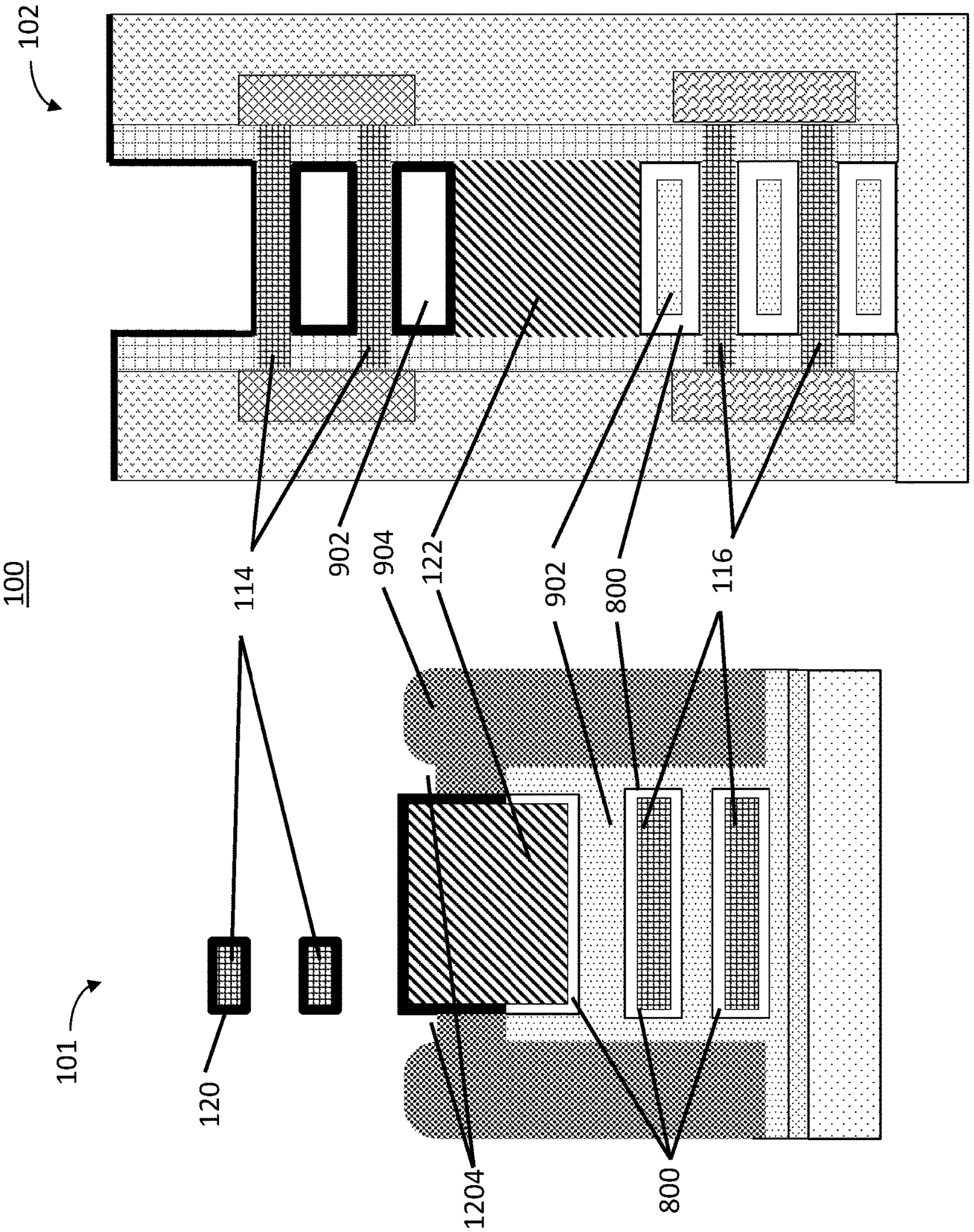
FIG. 13 illustrates cross-sectional views of the structure in FIG. 12 after an etching operation in one embodiment.

FIG. 13 illustrates cross-sectional views of the structure in FIG. 12 after an etching operation in one embodiment. In one embodiment, a metal etching operation can be performed to remove any WFM 902 that are above OPL 904 and OPL 1204. As shown in cross-sectional views 101 and 102, in response to the etching, there are no WFM deposited underneath top devices 114. The etching operation to remove WFM 902 above OPL 904 and OPL 1204 can include a wet etch chemistry or dry etch chemistry. Also, WFM 902 that are underneath OPL 1204 can be protected by OPL 904 during the metal etching operation to remove WFM 902 above OPL 904 and OPL 1204. If OPL 1204 were not formed, the etching in FIG. 13 may etch away portions of WFM 902 below level 1104 (see FIG. 11).

Figure 14:
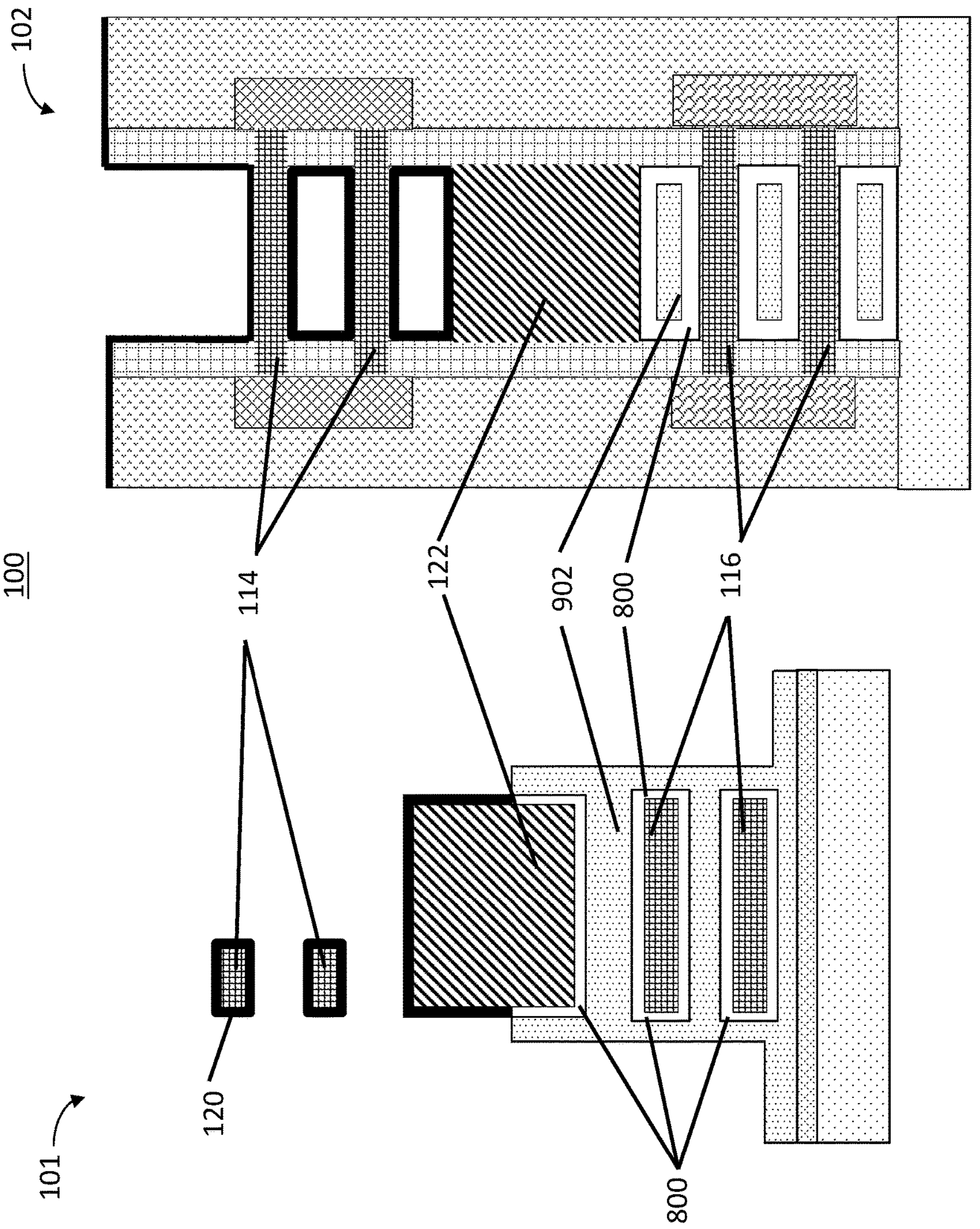
FIG. 14 illustrates cross-sectional views of the structure in FIG. 13 after an ashing operation in one embodiment.

FIG. 14 illustrates cross-sectional views of the structure in FIG. 13 after an ashing operation in one embodiment. In one embodiment, an ashing operation can be performed on the structure shown in FIG. 13 to remove OPL 904 and OPL 1204. In one embodiment, the ashing can include converting OPL 904 and 1204 to ash through plasma exposure. Upon the ashing operation, WFM 902 can remain on a portion of the sidewalls of isolation layer 122 and the top surface of WFM 902 can align with level 304 in FIG. 3, level 502 in FIG. 5, or the N/P boundary shown in FIG. 8. WFM 902 can the cover layer of metal-doped gate dielectric 800 in structure 100.

Figure 15:
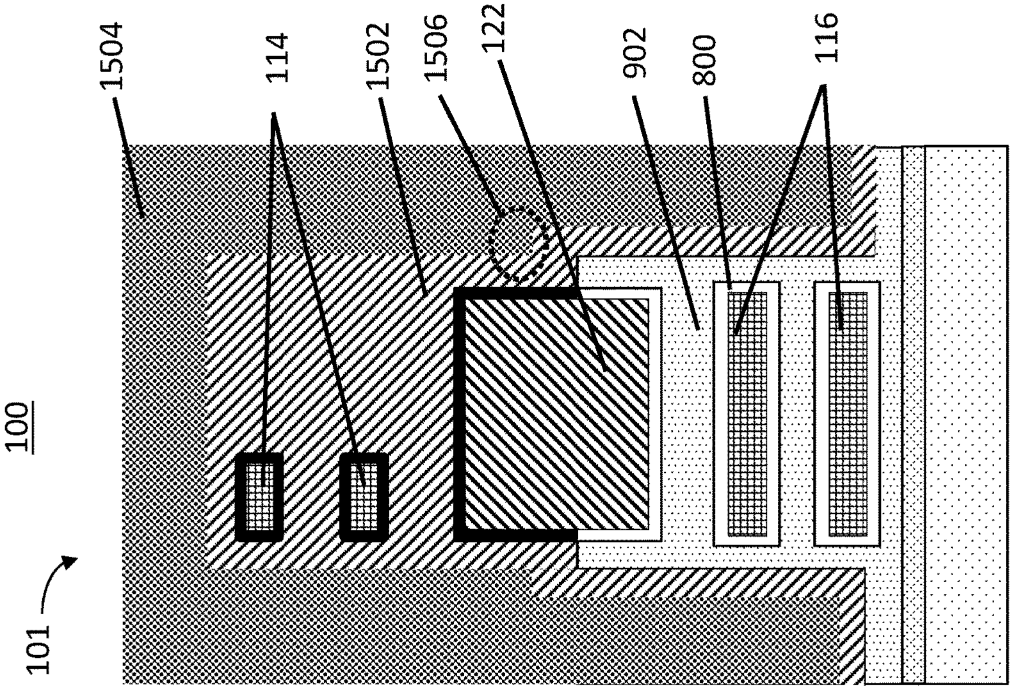
FIG. 15 illustrates cross-sectional views of the structure in FIG. 14 with work function materials and organic planarization layer in one embodiment.

FIG. 15 illustrates a cross-sectional view of the structure in FIG. 14 with work function materials and organic planarization layer in one embodiment. In one embodiment, to define threshold voltage for the top devices 114, which are doped as P-type transistors in the examples shown herein, a layer of WFM 1502 can be deposited to encompass structure 100 in FIG. 14. An OPL 1504 is also deposited to encompass WFM 1502. In the embodiment shown in FIG. 15, top devices 114 can be doped as P-type transistor and WFM 1502 can be P-type work function metals. OPL 1504 can include organic materials that are flowable, such as photoresist, various types of polymers and dielectrics, or other types of materials that are flowable. OPL 1504 can be deposited on WFM 1502 using various techniques, such as by spin on or deposited through PVD, CVD, ALD, or a combination of such deposition methods. In the embodiment shown in FIG. 15, WFM 1502 can form a step 1506 near the top surface of WFM 902. The step 1506 can provide protection to the top surface of WFM 902.

Figure 16:
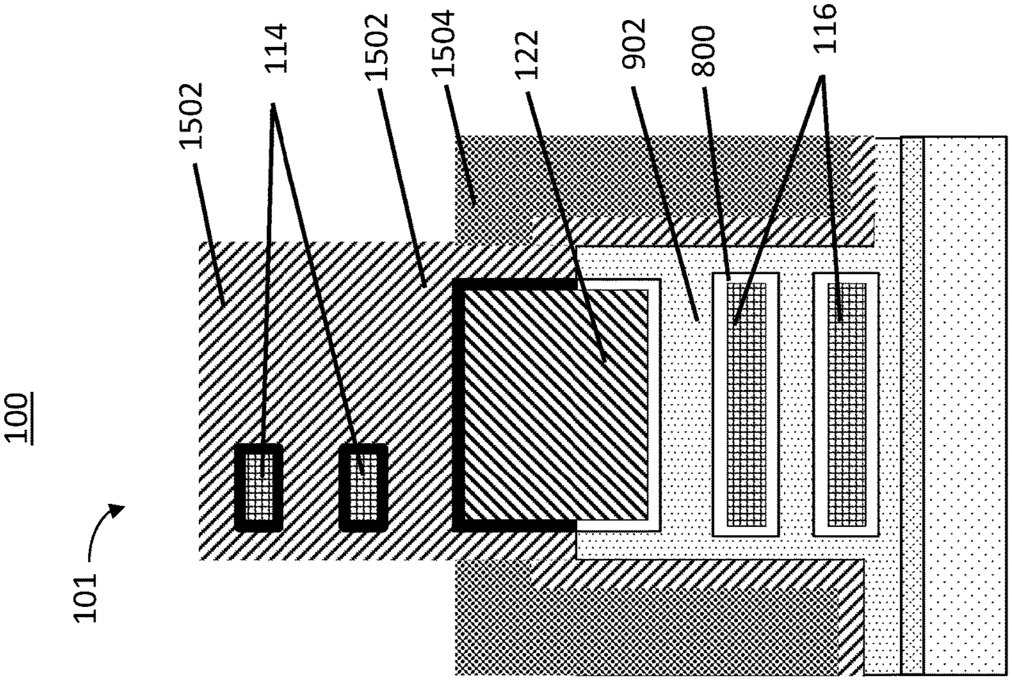
FIG. 16 illustrates cross-sectional views of the structure in FIG. 15 after a baking operation in one embodiment.

FIG. 16 illustrates cross-sectional views of the structure in FIG. 15 after a baking operation in one embodiment. In one embodiment, structure 100 shown in FIG. 15 can undergo a low temperature baking operation to reduce OPL 1504 to align with the top surface of isolation layer 122, such as level 202 shown in FIG. 2. An example range of temperatures for the low temperature baking operation of OPL 1504 can be approximately include 100-250 Celsius (C). The low temperature being used for the low temperature baking operation can stabilize OPL 1504 material to allow a wet or dry etch to remove portions of OPL 1504 without causing reflow of OPL 1504. As shown in FIG. 16, portions of OPL 1504 above top devices 114 are removed as a result of the low temperature baking operation.

Figure 17:
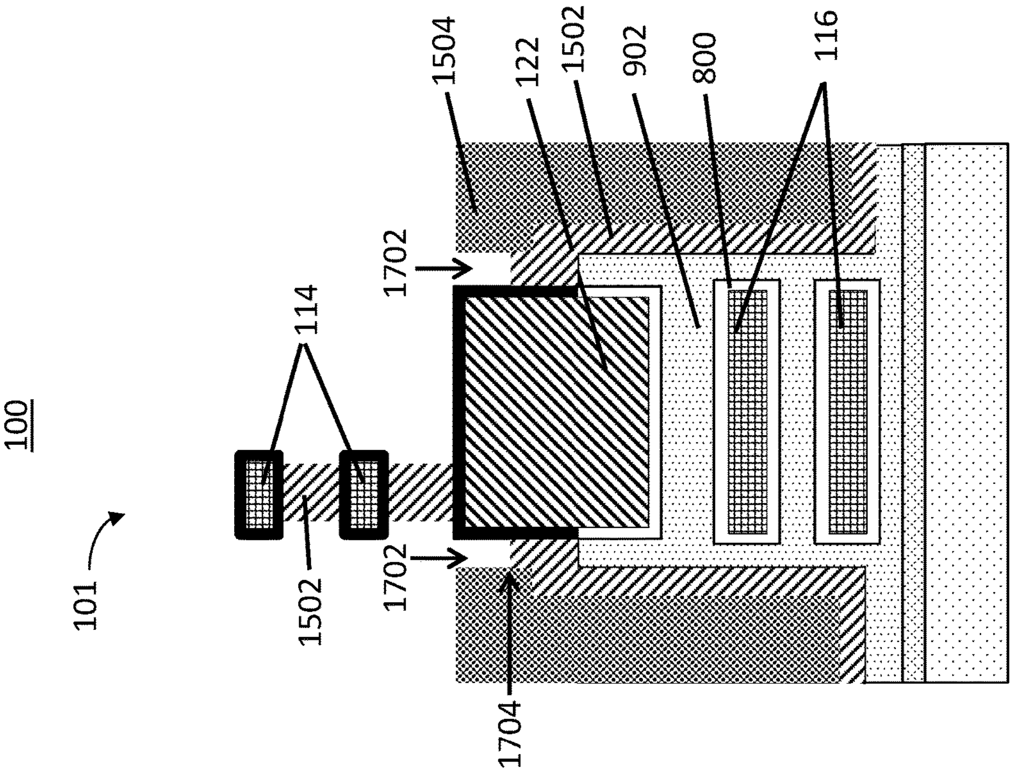
FIG. 17 illustrates cross-sectional views of the structure in FIG. 16 after an etching operation in one embodiment.

FIG. 17 illustrates cross-sectional views of the structure in FIG. 16 after an etching operation in one embodiment. In one embodiment, a metal etching operation can be performed to etch the WFM 1502 until two recesses 1702 are formed, where each one of recesses 1702 can be between a sidewall of isolation layer 122 and OPL 1504. The etching of WFM 1502 can include a wet etch chemistry or dry etch chemistry. In one or more embodiments, an example wet etch to form recesses 1702 can include using different chemicals for during durations of time during the wet etch operation. In one or more embodiments, an example dry etch to form recesses 1702 can include reactive ion etching, ion beam etching, plasma etching, laser ablation, or other dry etch techniques.

In one embodiment, the chemicals being used in the etching and the duration of the etching can impact a size, such as a depth (e.g., along the z-axis in FIG. 1), of recess 1702. In the embodiment shown in FIG. 17, the etching can cause recesses 1702 to have a depth of level 1704 from its previous level shown in FIG. 16. Further, the etching can cause an amount of WFM 1502 to remain underneath (e.g., −z direction) each one of top devices 114. In one embodiment, the chemicals being used in the etching and the duration of the etching can be predefined to ensure that portions of WFM 1502 remain underneath top devices 114 and recesses 1702 do not pass below level 1704. In one embodiment, level 1704 can be a depth level that is higher than (e.g., in the z direction) level 304 shown in FIG. 3, level 502 shown in FIG. 5, or the N/P boundary shown in FIG. 8.

Figure 18:
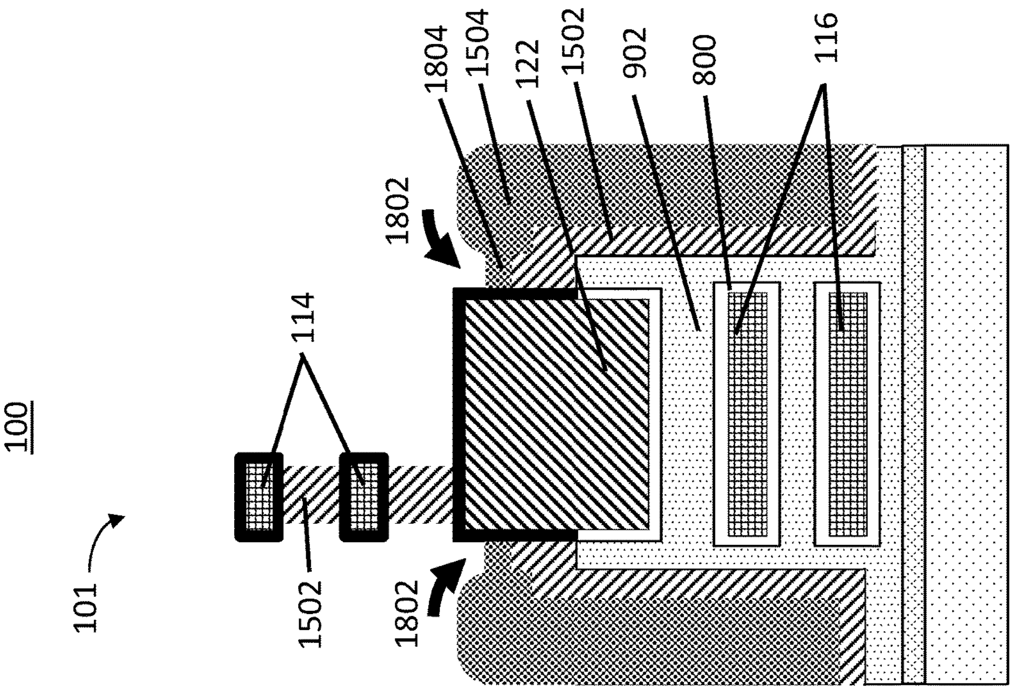
FIG. 18 illustrates cross-sectional views of the structure in FIG. 17 after a reflow operation in one embodiment.

FIG. 18 illustrates cross-sectional views of the structure in FIG. 17 after a reflow operation in one embodiment. In one embodiment, a reflow operation 1802 can be performed to reflow OPL 1504 into recesses 1702 of FIG. 17. The reflow operation 1802 can cause a volume of OPL 1804 to be formed in recesses 1702 and on top of WFM 1502 between sidewalls of isolation layer 122 and OPL 1504. As a result of forming OPL 1804, WFM 1502 will not be exposed to the top and further etching of WFM 1502 can be performed without removing WFM 1502 that is underneath the formed OPL 1804.

In one or more embodiments, reflow operation 1802 can include heating OPL 1504 to a high temperature to decrease viscosity of OPL 1504, which enables a portion of OPL 1504 to flow in a controlled manner. In one embodiment, the reflow operation 1802 can include heating OPL 1504 to a high temperature ranging from approximately 300-600° C. The temperature being used in the reflow operation 1802 can be higher than the temperature being used in the low temperature baking process associated with FIG. 16. In one or more embodiments, the reflow operation 1802 can include exposing OPL 1504 to ultraviolet (UV) radiation (and thermal energy, i.e., increased temperatures) to decrease viscosity of OPL 1504. In one or more embodiments, the reflow operation 1802 can be controlled by the temperature, gas flow, and pressure applied to OPL 1504.

Figure 19:
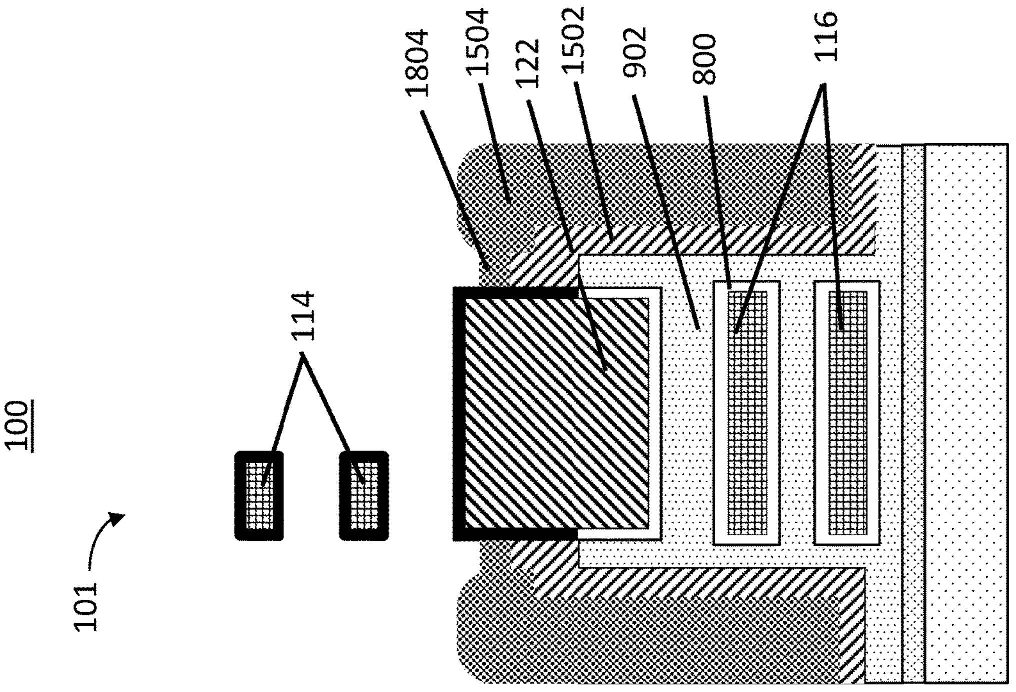
FIG. 19 illustrates cross-sectional views of the structure in FIG. 18 after an etching operation in one embodiment.

FIG. 19 illustrates cross-sectional views of the structure in FIG. 18 after an etching operation in one embodiment. In one embodiment, a metal etching operation can be performed to remove any WFM 1502 that are above OPL 1504 and OPL 1804. As shown in FIG. 19, in response to the etching, there are no WFM deposited underneath top devices 114. The etching operation to remove WFM 1502 above OPL 1504 and OPL 1804 can include a wet etch chemistry or dry etch chemistry. Also, WFM 1502 that are underneath OPL 1804 can be protected by OPL 1504 during the metal etching operation to remove WFM 1502 above OPL 1504 and OPL 1804. If OPL 1804 were not formed, the etching in FIG. 19 may etch away portions of WFM 1502 below level 1704 (see FIG. 11).

Figure 20:
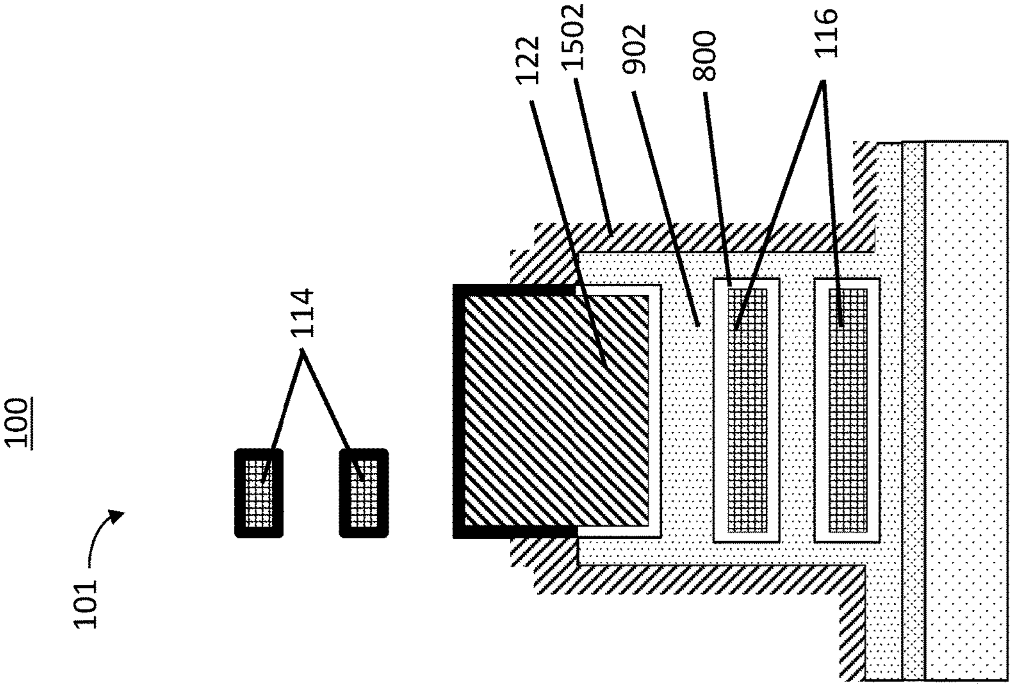
FIG. 20 illustrates cross-sectional views of the structure in FIG. 19 after an ashing operation in one embodiment.

FIG. 20 illustrates cross-sectional views of the structure in FIG. 19 after an ashing operation in one embodiment. In one embodiment, an ashing operation can be performed on the structure shown in FIG. 19 to remove OPL 1504 and OPL 1804. In one embodiment, the ashing can include converting OPL 1504 and 1804 to ash through plasma exposure. Upon the ashing operation, WFM 1502 can remain covering WFM 902 on a portion of the sidewalls of isolation layer 122 such that WFM 902 is not exposed to the environment surrounding structure 100. Further, the metal-doped high-k gate dielectric 800 encompassing the bottom devices 116 and encompassing the bottom portion of the isolation layer 122 can be disconnected from (e.g., not exposed, or not in contact with) WFM 1502.

Figure 21:
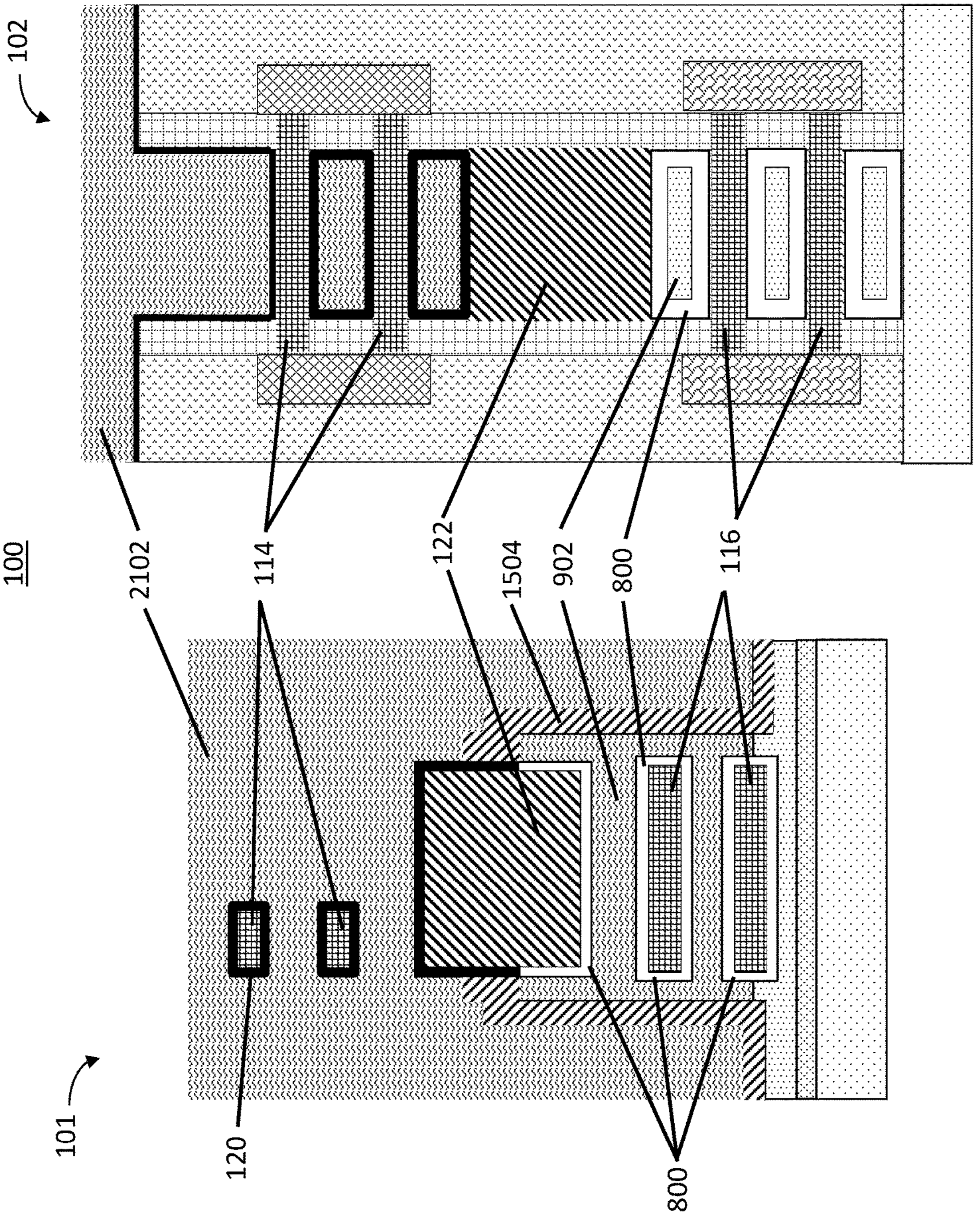
FIG. 21 illustrates cross-sectional views of the structure in FIG. 20 after depositing a layer of dielectric in one embodiment.

FIG. 21 illustrates cross-sectional views of the structure in FIG. 20 after depositing a layer of dielectric in one embodiment. In an example embodiment shown in FIG. 21, a layer of dielectrics 2102 can be deposited on structure 100 shown in FIG. 20. Dielectric 2102 can be low-k dielectrics (e.g., dielectrics having smaller dielectric constant relative to silicon dioxide) including but not limited to, organic polymers, carbon-doped oxides, spin-on low-k materials, and various oxide materials. The layer of dielectrics 2102 can be deposited to allow insertion of contacts to connect top devices 114 and bottom devices 116 to other electronic components external structure 100.

Figure 22:
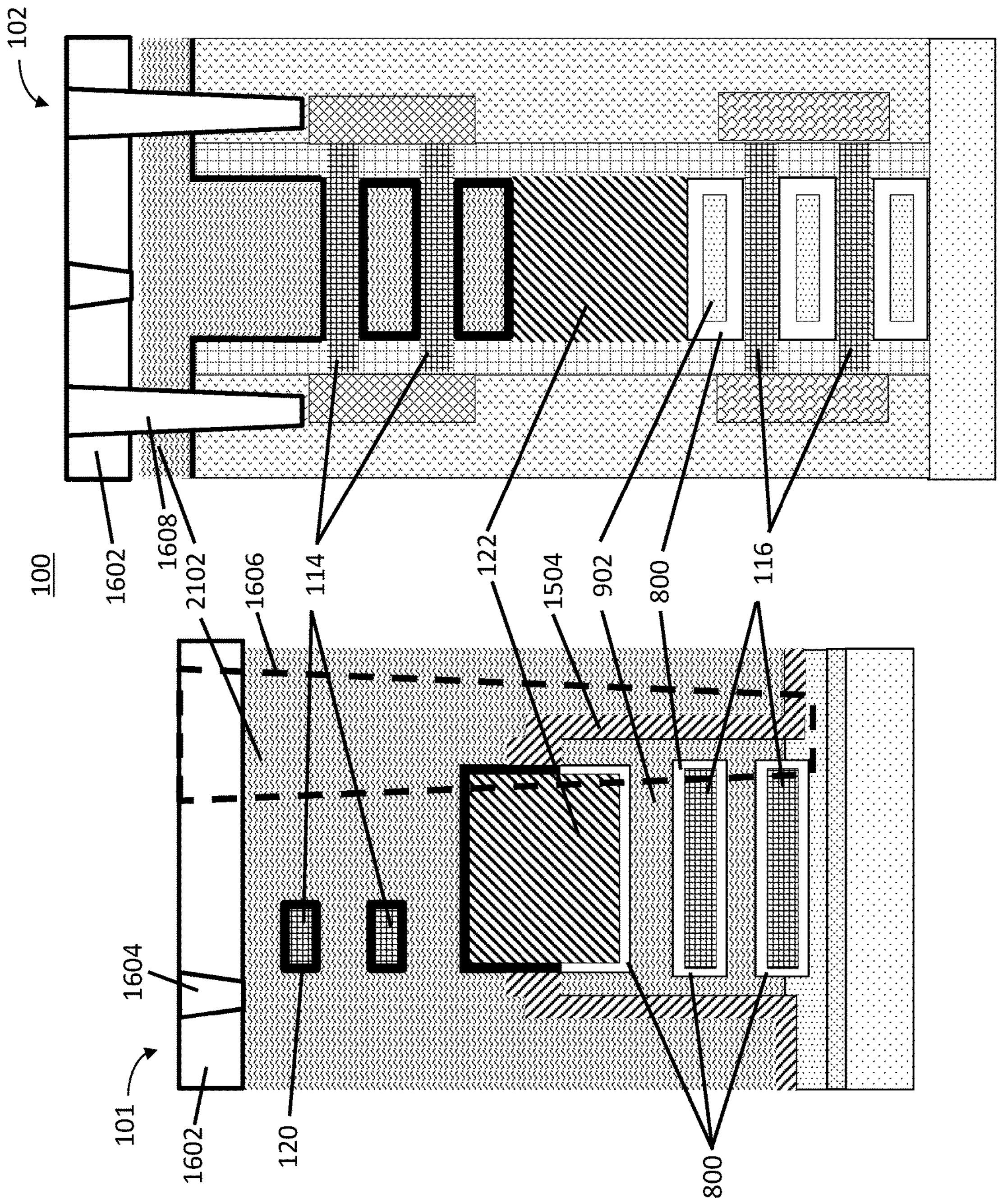
FIG. 22 illustrates cross-sectional views of the structure in FIG. 21 after inserting contacts in one embodiment.

FIG. 22 illustrates cross-sectional views of the structure in FIG. 21 after inserting contacts in one embodiment. In an example embodiment shown in FIG. 16, a plurality of contacts or vias 2202, 2204, 2206, 2208 can be inserted into structure 100 and through dielectrics 2102. Contacts 2202, 2204, 2206, 2208 can connect the gate electrodes of top devices 114 and bottom devices 116 to components internal or external to structure 100.

Figure 23:
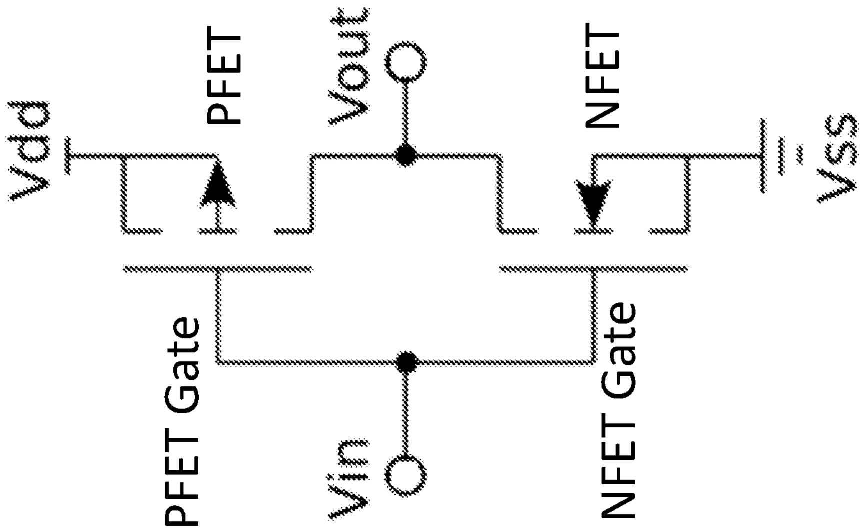
FIG. 23 illustrates an example application of a device formed by metal gate boundary control in stacked transistors in one embodiment.

FIG. 23 illustrates an example application of a device formed by metal gate boundary control in stacked transistors in one embodiment. In one embodiment, structure 100 shown in FIG. 20 to FIG. 22 can be part of a CMOS device 2300 shown in FIG. 23. CMOS device 2300 can include a top device that can be a P-type FET (PFET) and a bottom device that can be a N-type FET (NFET). Comparing FIG. 23 to FIG. 20, the PFET in FIG. 23 can be one or more of top devices 114 and the NFET in FIG. 23 can be one or more of bottom devices 116. Metal-doped gate dielectric 800 in FIG. 14 can be gate dielectrics between the metal 126 (see FIG. 1) and the source and drain of NFET. Dielectrics 120 in FIG. 14 can be gate dielectrics between the metal 124 (see FIG. 1) and the source and drain of the PFET.

The PFET and NFET devices can turn on or turn off depending on an input voltage Vin. When Vin is zero or at a low voltage (e.g., voltage representing binary low), the PFET can be turned on and the NFET can be turned off, thus pulling VDD, which can be a voltage representing binary one, to output voltage Vout. When Vin is one or at a high voltage (e.g., voltage representing binary high), the PFET can be turned off and the NFET can be turned on, thus pulling Vout towards VSS (e.g., VSS can be ground), thus Vout will be zero. Therefore, CMOS device 2300 can function as an inverter.

In an aspect, when Vin is greater than the NFET's source voltage by an absolute value of the NFET's threshold voltage, the NFET can be turned on. When Vin is less than the PFET's source voltage by an absolute value of the PFET's threshold voltage, the PFET can be turned on. There is a need to manufacture CMOS devices in a precise manner such that the threshold voltages of the PFET and NFET devices are accurately defined. In an aspect, inaccurate threshold voltages can lead to undesirable conditions such as both PFET and NFET being turned on for an undesired amount of time or using wrong amount of voltage as input voltage to turn on the PFET and NFET devices. For vertically stacked devices, there are challenges to achieving the target threshold devices of the PFET and NFET due to relatively small trench size for NFET patterning. The techniques described above with respect to FIG. 1 to FIG. 16 utilizes reflow of OPL to protect WFM that define the N/P boundary, such that additional etching operations corresponding to the top devices will not etch into the WFM defining the N/P boundary. Further, N-type dipole materials (e.g., dipole 118 described herein) such as Lanthanum (III) oxide ($La_2O_3$), Yttrium (III) oxide ($Y_2O_3$), or Magnesium oxide (MgO), can define the threshold voltage of the NFETs (e.g., bottom devices 116) along with N-type WFM (e.g., WFM 902) such as metal stack that includes titanium and aluminum layers. Metal nitride such as Titanium nitride (TiN) can be used for defining the threshold voltage of the PFETs (e.g., top devices 114) and the threshold voltage of the PFETs can be further tuned by adding P-type WFM (e.g., WFM 1502).

Figure 24:
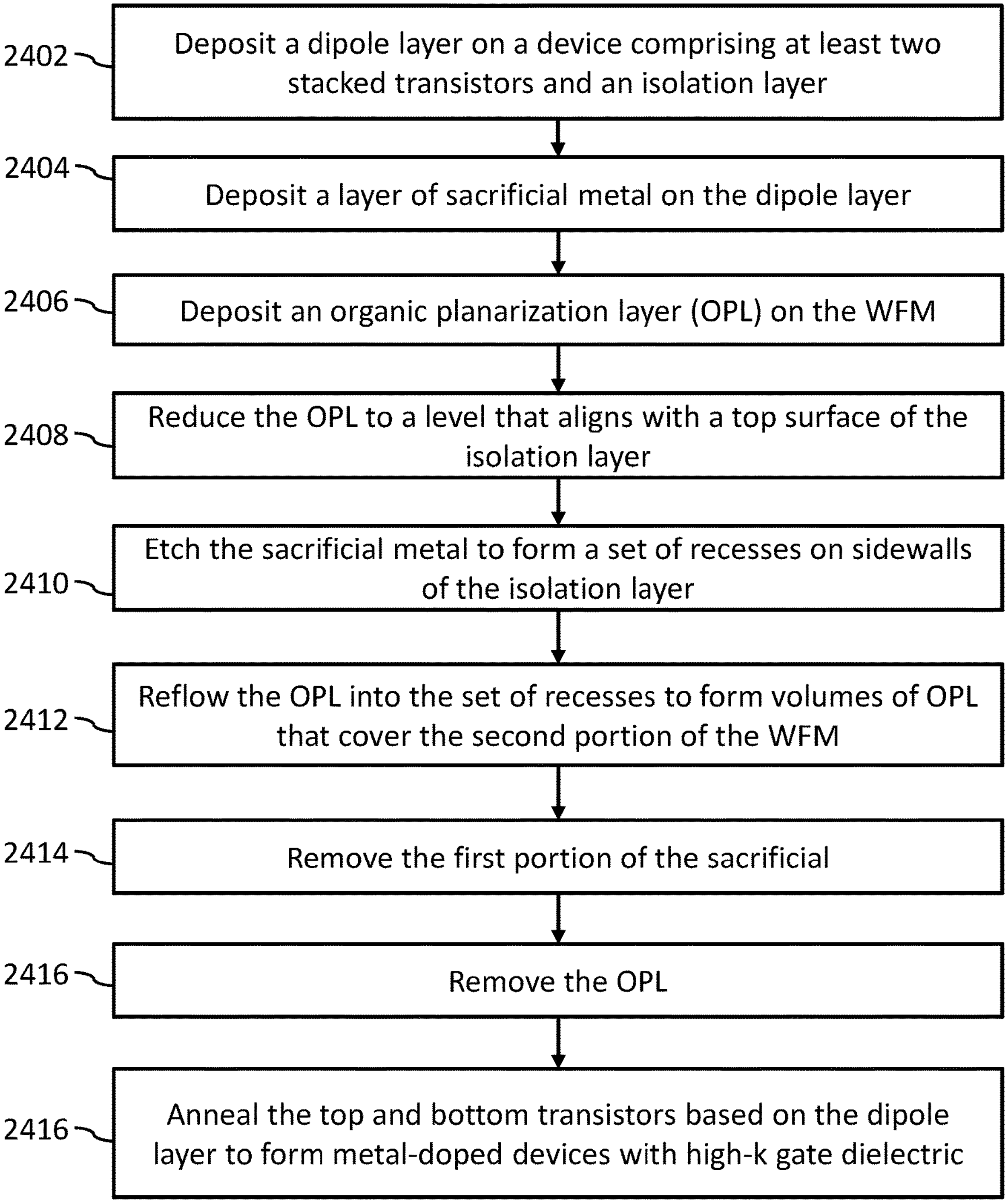
FIG. 24 illustrates a flow diagram relating to an implementation of metal gate boundary control in stacked transistors in one embodiment.

FIG. 24 illustrates a flow diagram relating to an implementation of metal gate boundary control in stacked transistors in one embodiment. The process 2400 in FIG. 24 can be implemented to form, for example, structures such as structure 100 in FIG. 14 as discussed above. The process 2400 can include one or more operations, actions, or functions as illustrated by one or more of blocks 2402, 2404, 2406, 2408, 2410, 2412, 2414, 2416 and/or 2418. Although illustrated as discrete blocks, various blocks may be divided into additional blocks, combined into fewer blocks, eliminated, performed in different order, or performed in parallel, depending on the desired implementation.

Process 2400 can begin at block 2402. At block 2402, a dipole layer of can be deposited on a device including at least two stacked transistors (e.g., transistor transistors) and an isolation layer. The two stacked transistors can include a top transistor and a bottom transistor and the isolation layer can be situated between the top transistor and the bottom transistor. In one embodiment, the top transistor and the bottom transistor can be stacked nanosheet transistors. In one embodiment, the dipole layer can include one of N-type dipole materials and P-type materials. Process 2400 can proceed from block 2402 to block 2404. At block 2404, a layer of sacrificial metal can be deposited on the dipole layer. In one embodiment, the sacrificial metal can be a metal nitride including one of Titanium Nitride (TiN) and Tungsten Nitride (WN).

Process 2400 can proceed from block 2404 to block 2406. At block 2406, an organic planarization layer (OPL) can be deposited on the sacrificial metal. Process 2400 can proceed from block 2406 to block 2408. At block 2408, the OPL can be reduced to a level that aligns with a top surface of the isolation layer. In one embodiment, the OPL can be reduced to the level that aligns with the top surface of the isolation layer comprises by baking the OPL at a first temperature and the OPL can be reflowed into the set of recesses by baking the OPL at a second temperature that is greater than the first temperature.

Process 2400 can proceed from block 2408 to block 2410. At block 2410, the sacrificial metal can be etched to form a set of recesses on sidewalls of the isolation layer. The depths of the set of recesses can define a transition boundary between the top transistor and the bottom transistor. In response to etching the sacrificial metal, a first portion of the sacrificial metal can remain above the top surface of the isolation layer and a second portion of sacrificial metal remains below the transition boundary.

Process 2400 can proceed from block 2410 to block 2412. At block 2412, the OPL can be reflowed into the set of recesses to form volumes of OPL that cover the second portion of the sacrificial metal. Process 2400 can proceed from block 2412 to block 2414. At block 2414, the first portion of the sacrificial metal can be removed. In response to removing the first portion of the sacrificial metal, the second portion of the sacrificial metal can remain below the volumes of OPL and below the transition boundary. Process 2400 can proceed from block 2414 to block 2416. At block 2416, the OPL can be removed. In one embodiment, the OPL can be removed by converting the OPL into ash. Process 2400 can proceed from block 2416 to block 2418. At block 2418, the top and bottom transistors can be annealed based on the dipole layer to form metal-doped devices with high-k gate dielectric.

In one embodiment, the top transistor can be encompassed by a first portion of the dipole layer. A first portion of the isolation layer can be encompassed by a second portion of the dipole layer. The first portion of the isolation layer can include a top surface of the isolation layer and a top portion of sidewalls of the isolation layer. A second portion of the isolation layer can be encompassed by a third portion of the dipole layer. The second portion of the isolation layer can include a bottom surface of the isolation layer and a bottom portion of sidewalls of the isolation layer. The bottom transistor can be encompassed by a fourth portion of the dipole layer. The first portion of the sacrificial metal can be removed by removing the first portion of dipole layer and removing the second portion of the dipole layer. In one embodiment, in response to the annealing, the top transistor can have P-type characteristics and the bottom transistor can have N-type characteristics. In one embodiment, in response to the annealing, the top transistor can have N-type characteristics and the bottom transistor can have P-type characteristics. In one embodiment, the dipole layer can include N-type dipole material or P-type dipole material.

Figure 25:
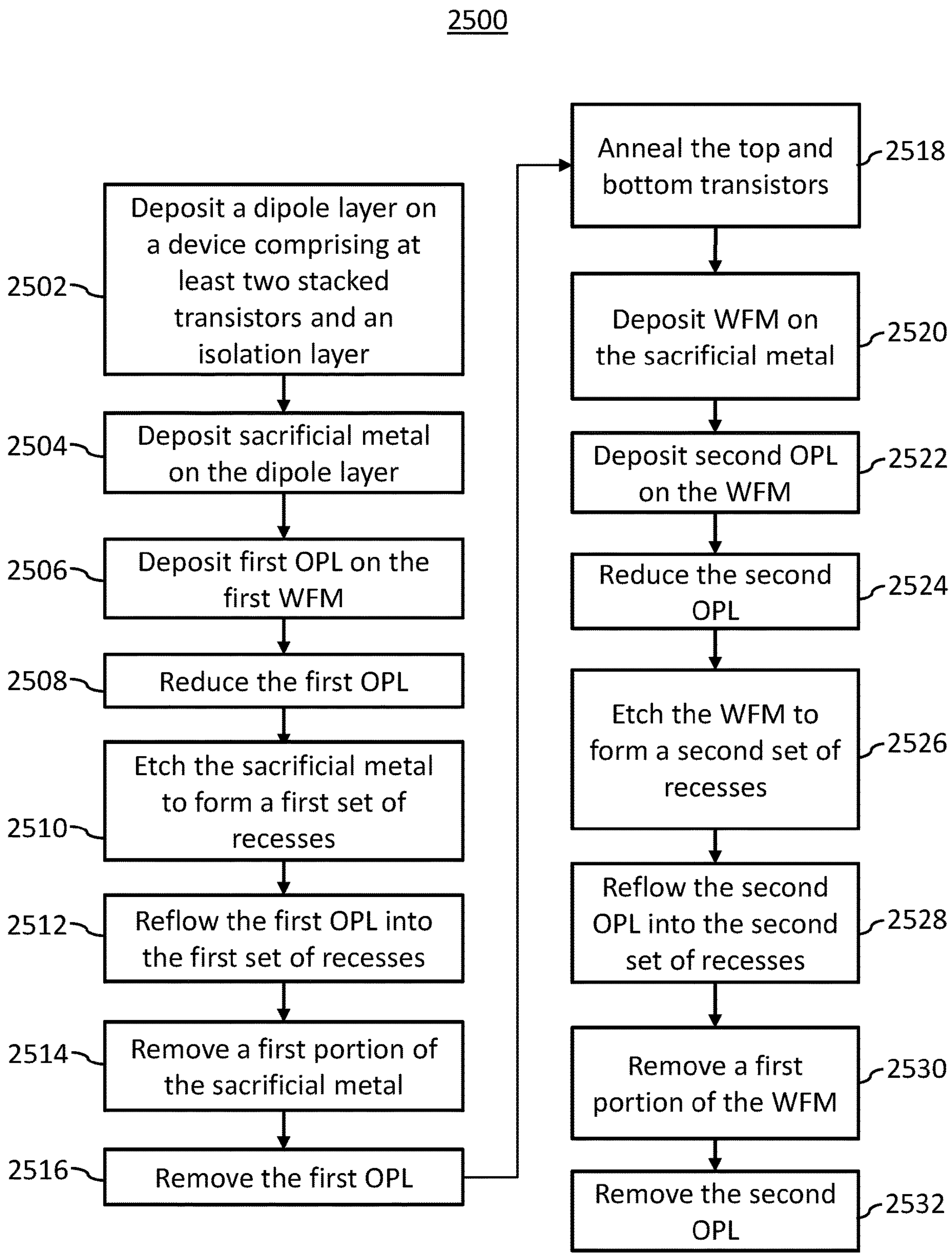
FIG. 25 illustrates another flow diagram relating to an implementation of metal gate boundary control in stacked transistors in one embodiment.

FIG. 25 illustrates another flow diagram relating to an implementation of metal gate boundary control in stacked transistors in one embodiment. The process 2500 in FIG. 25 may be implemented to form, for example, structures such as structure 100 in FIG. 21 discussed above. The process 2500 can include one or more operations, actions, or functions as illustrated by one or more of blocks 2502, 2504, 2506, 2508, 2510, 2512, 2514, 2516, 2518, 2520, 2522, 2524, 2526, 2528, 2530 and/or 2532. Although illustrated as discrete blocks, various blocks may be divided into additional blocks, combined into fewer blocks, eliminated, performed in different order, or performed in parallel, depending on the desired implementation.

Process 2500 can begin at block 2502. At block 2502, a dipole layer can be deposited on a device including at least two stacked transistors (e.g., transistor transistors) and an isolation layer. The two stacked transistors can include a top transistor and a bottom transistor and the isolation layer can be situated between the top transistor and the bottom transistor. In one embodiment, the top transistor and the bottom transistor can be stacked nanosheet transistors. Process 2500 can proceed from block 2502 to block 2504. At block 2504, a layer of sacrificial metal can be deposited on the dipole layer. In one embodiment, the sacrificial metal can be a metal nitride including one of Titanium Nitride (TiN) and Tungsten Nitride (WN).

Process 2500 can proceed from block 2504 to block 2506. At block 2506, a first OPL can be deposited on the sacrificial metal. Process 2500 can proceed from block 2506 to block 2508. At block 2508, the first OPL can be reduced to a level that aligns with a top surface of the isolation layer. Process 2500 can proceed from block 2508 to block 2510. At block 2510, the sacrificial metal can be etched to form a first set of recesses on sidewalls of the isolation layer. The depths of the first set of recesses can define a transition boundary between the top transistor and the bottom transistor. In response to etching the sacrificial metal, a first portion of the sacrificial metal can remain above the top surface of the isolation layer and a second portion of the sacrificial metal can remain below the transition boundary.

Process 2500 can proceed from block 2510 to block 2512. At block 2512, the first OPL can be reflowed into the first set of recesses to form volumes of first OPL that cover the second portion of the sacrificial metal. Process 2500 can proceed from block 2512 to block 2514. At block 2514, the first portion of the sacrificial metal can be removed. In response to removing the first portion of the sacrificial metal, the second portion of the sacrificial metal can remain below the volumes of the first OPL and below the transition boundary. Process 2500 can proceed from block 2514 to block 2516. At block 2516, the first OPL can be removed. Process 2500 can proceed from block 2516 to block 2518. At block 2518, the top and bottom transistors can be annealed based on the dipole layer to form metal-doped devices with high-k gate dielectric.

Process 2500 can proceed from block 2518 to block 2520. At block 2520, a layer of work function materials (WFM) can be deposited to cover the second portion of the sacrificial metal on the isolation layer, the top transistor and the bottom transistor. Process 2500 can proceed from block 2520 to block 2522. At block 2522, a second OPL can be deposited on the WFM. Process 2500 can proceed from block 2522 to block 2524. At block 2524, the second OPL can be reduced to a level that aligns with the top surface of the isolation layer.

Process 2500 can proceed from block 2524 to block 2526. At block 2526, the WFM can be etched to form a second set of recesses on sidewalls of the isolation layer. In response to etching the WFM, a first portion of the WFM can remain above the top surface of the isolation layer, and a second portion of the WFM can remain below the top surface of the isolation layer. The second portion of the WFM can continue to cover the second portion of the sacrificial metal.

Process 2500 can proceed from block 2526 to block 2528. At block 2528, the second OPL can be reflowed into the second set of recesses to form volumes of second OPL that cover the second portion of the WFM. Process 2500 can proceed from block 2528 to block 2530. At block 2530, the first portion of the WFM can be removed. In response to removing the first portion of the WFM, the second portion of the WFM can remain below the volumes of the second OPL and below the top surface of the isolation layer. Process 2500 can proceed from block 2530 to block 2532. At block 2532, the second OPL can be removed. In one embodiment, the first OPL can be removed by converting the first OPL into ash and the second OPL can be removed by converting the second OPL into ash.

In one embodiment, the first OPL can be reduced to the level that aligns with the top surface of the isolation layer comprises baking the first OPL at a first temperature. The first OPL can be reflowed into the first set of recesses by baking the first OPL at a second temperature that is greater than the first temperature. The second OPL reduced to the level that aligns with the top surface of the isolation layer by baking the second OPL at the first temperature. The second OPL can be reflowed into the second set of recesses by baking the second OPL at the second temperature that is greater than the first temperature.

In one embodiment, the top transistor can be encompassed by a first portion of the dipole layer. The first portion of the isolation layer can be encompassed by a second portion of the dipole layer. The first portion of the isolation layer can include a top surface of the isolation layer and a top portion of sidewalls of the isolation layer. A second portion of the isolation layer can be encompassed by a third portion of the dipole layer. The second portion of the isolation layer can include a bottom surface of the isolation layer and a bottom portion of sidewalls of the isolation layer. The bottom transistor can be encompassed by a fourth portion of the dipole layer. The first portion of the sacrificial metal can also remove the first portion of dipole layer and removing the second portion of the dipole layer. In one embodiment, in response to the annealing, the top transistor can have P-type characteristics and the bottom transistor can have N-type characteristics. In one embodiment, in response to the annealing, the top transistor can have N-type characteristics and the bottom transistor can have P-type characteristics. In one embodiment, the dipole layer can include N-type dipole material or P-type dipole material.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:

depositing a dipole layer on a device comprising at least two stacked transistors and an isolation layer, wherein the two stacked transistors comprises at least a top transistor and a bottom transistor, and the isolation layer is situated between the top transistor and the bottom transistor;

depositing a layer of sacrificial metal on the dipole layer;

depositing an organic planarization layer (OPL) on the sacrificial metal;

reducing the OPL to a level that aligns with a top surface of the isolation layer;

etching the sacrificial metal to form a set of recesses on sidewalls of the isolation layer, wherein depths of the set of recesses define a transition boundary between the top transistor and the bottom transistor, and wherein in response to etching the sacrificial metal, a first portion of the sacrificial metal remains above the top surface of the isolation layer and a second portion of sacrificial metal remains below the transition boundary;

reflowing the OPL into the set of recesses to form volumes of OPL that cover the second portion of the sacrificial metal;

removing the first portion of the sacrificial metal, wherein in response to removing the first portion of the sacrificial metal, the second portion of the sacrificial metal remains below the volumes of OPL and below the transition boundary;

removing the OPL; and annealing the top and bottom transistors based on the dipole layer to form metal-doped devices with high-k gate dielectric.

2. The method of claim 1, wherein the sacrificial metal is a metal nitride including one of Titanium Nitride (TiN) and Tungsten Nitride (WN).

3. The method of claim 1, wherein:

reducing the OPL to the level that aligns with the top surface of the isolation layer comprises baking the OPL at a first temperature; and reflowing the OPL into the set of recesses comprises baking the OPL at a second temperature that is greater than the first temperature.

4. The method of claim 1, wherein removing the OPL comprises converting the OPL into ash.

5. The method of claim 1, wherein:

the top transistor is encompassed by a first portion of the dipole layer;

a first portion of the isolation layer is encompassed by a second portion of the dipole layer, wherein the first portion of the isolation layer comprises a top surface of the isolation layer and a top portion of sidewalls of the isolation layer;

a second portion of the isolation layer is encompassed by a third portion of the dipole layer, wherein the second portion of the isolation layer comprises a bottom surface of the isolation layer and a bottom portion of sidewalls of the isolation layer;

the bottom transistor is encompassed by a fourth portion of the dipole material; and removing the first portion of the sacrificial metal comprises removing the first portion of the dipole layer and removing the second portion of the dipole layer.

6. The method of claim 5, wherein the top transistor and the bottom transistor are stacked nanosheet transistors.

7. The method of claim 1, wherein in response to the annealing:

the top transistor has P-type characteristics and the bottom transistor has N-type characteristics; and the dipole layer comprises one of N-type dipole material and P-type dipole material.

8. The method of claim 1, wherein in response to the annealing:

the top transistor has N-type characteristics and the bottom transistor has N-type characteristics; and the dipole layer comprises one of N-type dipole material and P-type dipole material.

9. A method comprising:

depositing a dipole layer on a device comprising at least two stacked transistors and an isolation layer, wherein the two stacked transistors comprises at least a top transistor and a bottom transistor, and the isolation layer is situated between the top transistor and the bottom transistor;

depositing a layer of sacrificial metal on the dipole layer;

depositing a first organic planarization layer (OPL) on the sacrificial metal;

reducing the first OPL to a level that aligns with a top surface of the isolation layer;

etching the sacrificial metal to form a first set of recesses on sidewalls of the isolation layer, wherein depths of the first set of recesses define a transition boundary between the top transistor and the bottom transistor, and wherein in response to etching the sacrificial metal, a first portion of the sacrificial metal remains above the top surface of the isolation layer and a second portion of the sacrificial metal remains below the transition boundary;

reflowing the first OPL into the first set of recesses to form volumes of first OPL that cover the second portion of the sacrificial metal;

removing the first portion of the sacrificial metal, wherein in response to removing the first portion of the sacrificial metal, the second portion of the sacrificial metal remains below the volumes of the first OPL and below the transition boundary;

removing the first OPL;

annealing the top and bottom transistors based on the dipole layer to form metal-doped devices with high-k gate dielectric;

depositing a layer of work function material (WFM) to cover the top transistor and the bottom transistor;

depositing a second OPL on the WFM;

reducing the second OPL to a level that aligns with the top surface of the isolation layer;

etching the WFM to form a second set of recesses on sidewalls of the isolation layer, wherein in response to etching the WFM, a first portion of the WFM remains above the top surface of the isolation layer, a second portion of the WFM remains below the top surface of the isolation layer, and the second portion of the WFM continues to cover the second portion of the sacrificial metal;

reflowing the second OPL into the second set of recesses to form volumes of the second OPL that cover the second portion of the WFM;

removing the first portion of the WFM, wherein in response to removing the first portion of the WFM, the second portion of the WFM remains below the volumes of the second OPL and below the top surface of the isolation layer; and removing the second OPL.

10. The method of claim 9, wherein the sacrificial metal is a metal nitride including one of Titanium Nitride (TiN) and Tungsten Nitride (WN).

11. The method of claim 9, wherein:

reducing the first OPL to the level that aligns with the top surface of the isolation layer comprises baking the first OPL at a first temperature;

reflowing the first OPL into the first set of recesses comprises baking the first OPL at a second temperature that is greater than the first temperature;

reducing the second OPL to the level that aligns with the top surface of the isolation layer comprises baking the second OPL at the first temperature; and reflowing the second OPL into the second set of recesses comprises baking the second OPL at the second temperature that is greater than the first temperature.

12. The method of claim 8, wherein:

removing the first OPL comprises converting the first OPL into ash; and removing the second OPL comprises converting the second OPL into ash.

13. The method of claim 9, wherein:

the top transistor is encompassed by a first portion of the dipole layer;

a first portion of the isolation layer is encompassed by a second portion of the dipole layer, wherein the first portion of the isolation layer comprises a top surface of the isolation layer and a top portion of sidewalls of the isolation layer;

a second portion of the isolation layer is encompassed by a third portion of the dipole layer, wherein the second portion of the isolation layer comprises a bottom surface of the isolation layer and a bottom portion of sidewalls of the isolation layer;

the bottom transistor is encompassed by a fourth portion of the dipole layer; and removing the first portion of the first WFM comprises removing the first portion of the dipole layer and removing the second portion of the dipole layer.

14. The method of claim 13, wherein the top transistor and the bottom transistor are stacked nanosheet transistors.

15. The method of claim 13, wherein in response to the annealing:

the top transistor has P-type characteristics and the bottom transistor has N-type characteristics; and the dipole layer comprises one of N-type dipole materials and P-type materials.

16. The method of claim 13, wherein in response to the annealing:

the top transistor has N-type characteristics and the bottom transistor has N-type characteristics; and the dipole layer comprises one of N-type dipole materials and P-type materials.

* * * * *